(12) United States Patent
Roscheisen et al.

(10) Patent No.: US 7,594,982 B1
(45) Date of Patent: Sep. 29, 2009

(54) NANOSTRUCTURED TRANSPARENT CONDUCTING ELECTRODE

(75) Inventors: Martin R. Roscheisen, San Francisco, CA (US); Brian M. Sager, Palo Alto, CA (US)

(73) Assignee: Nanosolar, Inc., San Jose, CA (US)

( * ) Notice: Subject to any disclaimer, the term of this patent is extended or adjusted under 35 U.S.C. 154(b) by 405 days.

(21) Appl. No.: 10/338,079

(22) Filed: Jan. 6, 2003

Related U.S. Application Data

(63) Continuation-in-part of application No. 10/290,119, filed on Nov. 5, 2002, now Pat. No. 7,291,782, and a continuation-in-part of application No. 10/303,665, filed on Nov. 22, 2002, now Pat. No. 7,253,017, and a continuation-in-part of application No. 10/319,406, filed on Dec. 11, 2002, now Pat. No. 6,852,920.

(60) Provisional application No. 60/390,904, filed on Jun. 22, 2002.

(51) Int. Cl.
*B32B 17/00* (2006.01)
*H01M 4/02* (2006.01)

(52) U.S. Cl. .................. 204/284; 429/209; 136/263; 977/781; 428/432

(58) Field of Classification Search .......... 429/209; 136/263; 977/781; 428/432; 204/284
See application file for complete search history.

(56) References Cited

U.S. PATENT DOCUMENTS

| | | |
|---|---|---|
| 4,499,658 A | 2/1985 | Lewis |
| 5,482,570 A | 1/1996 | Saurer et al. ............... 136/255 |
| 5,525,440 A | 6/1996 | Kay et al. ................... 429/111 |
| 5,571,612 A | 11/1996 | Motohiro et al. |

(Continued)

FOREIGN PATENT DOCUMENTS

DE 2741954 3/1979

(Continued)

OTHER PUBLICATIONS

D. Zhao et al. "Triblock Copolymer Syntheses of Mesoporous Silica with Periodic 50 to 300 Angstrom Pores" Science, 279, 548-552. (1998).*

(Continued)

*Primary Examiner*—Jeffrey T. Barton

(57) ABSTRACT

Transparent conducting electrodes, methods for manufacturing such conducting electrodes, optoelectronic devices incorporating such transparent electrodes and methods for making such optoelectronic devices and solar power generation systems incorporating such electrodes are disclosed. Nanostructured transparent conducting electrodes may include a nano-architected porous film having a network of ordered interconnected pores and an electrically conductive material that substantially fills the pores. The nano-architected porous film may be disposed on a layer of transparent conducting material. The electrode may include a substrate (e.g., glass or polymer) and the layer of transparent conducting material may be disposed between the substrate and the nano-architected porous film. Nanostructured transparent conducting electrodes may be fabricated by forming a nano-architected porous film, e.g., by surfactant temptation, on a layer of transparent conducting material and substantially filling the pores in the nano-architected porous film with an electrically conductive material, e.g., by electrodeposition. Optoelectronic devices may incorporate one or more nanostructured transparent conducting electrodes in electrical contact with an active layer. Such devices may be made by fabricating a first electrode and disposing an active layer between the first electrode and a second electrode, one of which is a nanostructured transparent conducting electrode.

68 Claims, 16 Drawing Sheets

U.S. PATENT DOCUMENTS

| | | | |
|---|---|---|---|
| 5,674,325 | A | 10/1997 | Albright et al. |
| 5,795,559 | A | 8/1998 | Pinnavaia et al. |
| 5,858,457 | A * | 1/1999 | Brinker et al. ............... 427/162 |
| 5,986,206 | A | 11/1999 | Kambe et al. |
| 5,990,415 | A | 11/1999 | Green et al. |
| 6,075,203 | A | 6/2000 | Wang et al. |
| 6,096,288 | A * | 8/2000 | Roth .......................... 423/702 |
| 6,270,846 | B1 * | 8/2001 | Brinker et al. ............... 428/64.1 |
| 6,278,056 | B1 | 8/2001 | Sugihara et al. ............. 136/263 |
| 6,291,763 | B1 | 9/2001 | Nakamura |
| 6,340,789 | B1 | 1/2002 | Petritsch et al. ............. 136/263 |
| 6,344,272 | B1 | 2/2002 | Oldenburg et al. |
| 6,580,026 | B1 * | 6/2003 | Koyanagi et al. ........... 136/263 |
| 6,733,828 | B2 * | 5/2004 | Chao et al. ................... 427/239 |
| 6,852,920 | B2 | 2/2005 | Sager et al. |
| 6,946,597 | B2 | 9/2005 | Sager et al. |
| 7,001,669 | B2 * | 2/2006 | Lu et al. ...................... 428/613 |
| 7,253,017 | B1 | 8/2007 | Roscheisen et al. |
| 7,291,782 | B2 | 11/2007 | Sager et al. |
| 2002/0017656 | A1 | 2/2002 | Graetzel et al. ............. 257/184 |
| 2002/0134426 | A1 | 9/2002 | Chiba et al. ................. 136/263 |
| 2002/0192441 | A1 | 12/2002 | Kalkan et al. |
| 2003/0226498 | A1 | 12/2003 | Alivisatos et al. |
| 2004/0084080 | A1 | 5/2004 | Sager et al. |
| 2004/0109666 | A1 | 6/2004 | Kim, II |
| 2004/0118448 | A1 | 6/2004 | Scher et al. |
| 2004/0146560 | A1 | 7/2004 | Whiteford et al. |
| 2004/0178390 | A1 | 9/2004 | Whiteford et al. |
| 2005/0098204 | A1 | 5/2005 | Roscheisen et al. |
| 2005/0098205 | A1 | 5/2005 | Roscheisen et al. |
| 2005/0183767 | A1 | 8/2005 | Yu et al. |
| 2005/0183768 | A1 | 8/2005 | Roscheisen et al. |
| 2005/0206306 | A1 | 9/2005 | Perlo et al. |

FOREIGN PATENT DOCUMENTS

| | | |
|---|---|---|
| EP | 1028475 | 8/2000 |
| EP | 1087446 | 3/2001 |
| WO | WO 02/084708 | 10/2002 |

OTHER PUBLICATIONS

R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).*

M. H. Huang et al. "Catalytic Growth of Zinc Oxide Nanowires by Vapor Transport" Adv. Mater. 13, 113-116. (Jan. 2001).*

Y. Lu et al, "Self-assembly of mesoscopically ordered chromatic polydiacetylene/silica nanocomposites". Nature. 410, 913-917. (2001).*

M. Granstrom, K. Petritsch, A. C. Arias, A. Lux, M. R. Andersson & R. H. Friend. 1998. Laminated fabrication of polymeric photovoltaic diodes. Nature 395, 257-260.

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye-sensitized nanoporous TiO2 electrods and conjugated polymers as hole transport materials. Synthetic Metals 123, 279-287.

Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid-state dye sensitized TiO2 solar cells to liquid junction devices.Solar Energy Materials & Solar Cells, in press.

Hongyou Fan, Yunfeng Lu, Aaron Stump, Scott T. Reed, Tom Baer, Randy Schunk, Victor Perez-Luna, Gabriel P. Lopez & C. Jeffrey Brinker. 2000. Rapid prototyping of patterned functional nanostructures, Nature 405, 56-60.

Alan Sellinger, Pilar M.Weiss, Anh Nguyen, Yunfeng Lu, Roger A. Assink, Weiliang Gong & C. Jeffrey Brinker. 1998. Continuous self-assembly of organic-inorganic nanocomposite coatings that mimic nacre. Nature 394, 256-260.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. Continuous formation of supported cubic and hexagonal mesoporous films by sol—gel dip-coating. Science 288, 652-656.

L. Schmidt-Mende, A. Fechtenkotter, K. Mullen, E. Moons,R. H. Friend, J. D. MacKenzie. 2002. Self-Organized Discotic Liquid Crystals for High-Efficiency Organic Photovoltaics. Science 293, 1119-1122.

Wendy U. Huynh; Janke J. Dittmer, A. Paul Alivisatos. 2002. Hybrid Nanorod-PolymerSolar Cells. Science 295, 2425-2427.

Thuc-Quyen Nguyen, Junjun Wu, Vinh Doan, Benjamin J. Schwartz, Sarah H. Tolbert. 2000. Control of Energy Transfer in Oriented Conjugated Polymer-Mesoporous Silica Composites. Science 288, 652-656.

Heeger, A.J. 2002 Semiconducting and metallic polymers: the fourth and fifth generation of polymeric materials. Synthetic Metals 125, 23-42.

Michael H. Huang, Amer Choudrey and Peidong Yang, "Ag Nanowire Formation within Mesoporous Silica" Chem. Commun., 2000, 1063-1064.

Andrew A. Gewirth, Panos C. Andricacos, and Jay A. Switzer, with John O. Dukovic, editor "Hot Topics in Electrodeposition", The Electrochemical Society Interface—Spring 1998.

Heini Saloniemi, "Electrodeposition of PbS, PbSe and PbTe Thin Films" by Heini Saloniemi, VTT Publications 423, Dec. 15, 2000, an electronic copy of which may be accessed at http://www.inf.vtt.fi/pdf/publications/2000/P423.pdf.

Huang Y, Duan, X, Wei, Q, & C.M. Lieber, "Directed Assembly Of One-Dimensional Nanostructures Into Functional Networks" Science 291(5504):630-633 (2001).

Byung Hee Hong, Sung Chul Bae, Chi-Wan Lee, Sukmin Jeong, and Kwang S. Kim, "Ultrathin Single-Crystalline Silver Nanowire Arrays Formed in an Ambient Solution Phase", Science 294: 348-351; Published online Sep. 6, 2001.

Justin D. Holmes, Keith P. Johnston, R. Christopher Doty, and Brian A. Korgel, "Control of Thickness and Orientation of Solution-Grown Silicon Nanowires" Science Feb. 25, 2000; 287: 1471-1473.

Lu, Y., Yang, Y., Sellinger, A., Lu, M., Huang, J., Fan, H., Haddad, R., Lopez, G., Burns, A.R., Sasaki, D.Y., Shelnutt, J., and C. J. Brinker, "Self-Assembly of Mesoscopically Ordered Chromatic Polydiacetylene Nanocomposites", Nature 410: 913-917 (2001.).

Halls et al., "Efficient Photodiodes from interpenetrating Polymer Networks", Nature, vol. 376 Aug. 10, 1995.

O'Regan et al. "A Low-cost, High-efficiency solar cells based on dye-sensitized colloidal $TiO_2$ Films", Nature, vol. 353 pp. 737-740, Oct. 24, 1991.

Mapes et al., "Ionic Conductivities of Poly(siloxane) Polymer Electrolytes with Varying Length of Linear Ethoxy Sidechains, Different Molecular Weights, and Mixed Copolymers", Polymer Preprints, 41(1), pp. 309-310 (2000).

Hooper et al., "A Highly Conductive Solid-State Polymer Electrolyte Based on Double-Comb Polysiloxane Polymer with Oligo(ethylene oxide) Side Chains", Organometallics, vol. 18, No. 17, Aug. 16, 1999.

Nazeeruddin et al. "Conversion of Light to Electricity by cis-$X_2$Bis(2,2'-bipyridyl-4,4'-dicarboxylate) ruthenium(II) Charge-Transfer Sensitizers (X=CI$^-$, BR$^-$, I$^-$, CN$^-$, and SCN$^-$) on Nanocrystalline $TiO_2$ Electrodes", Journal of the American Chemical Society 1993, 115, pp. 6382-6390 (1993).

Green et al. "Solar Cell Efficiency Tables (version 11)", Proges in Photovoltaics: Research and Applications, 6, 35-42 (1998).

Gebeyehu et al, "Solid-State Organic/inorganic Hybrid Solar Cells Based on Conjugated Polymers and Dye-Sensitized $TiO_2$ Electrodes", Thin Solid Films, 403-404, pp. 271-274 (2002).

Barbé et al., "Nancrystalline Titanium Oxide Electrodes for Photovoltaic Applications", Journal of the American Ceramic Society, 80 (12), pp. 3157-3171 (1997).

G. Sauer, G. Brehm, and S. Schneider, K. Nielsch, R. B. Wehrspohn,[a)] J. Choi, H. Hofmeister, and U. Gösele, "Highly Ordered Monocrystalline Silver Nanowire Arrays," Journal of Applied Physics, vol. 91, No. 5, Mar. 1, 2002.

D. R. Kammler, T. O. Mason, D. L. Young, T. J. Coutts, D. Ko, K. R. Poeppelmeier, D. L. Williamson, "Comparison of thin film and bulk forms of the transparent conducting oxide solution $Cd_{1+x} In_{2-2x} Sn_x O_4$," Journal of Applied Physics, vol 90, No. 12, Dec. 15, 2001.

Brian G. Lewis and David C. Paine, "Applications and Processing of Transparent Conducting Oxides," MRS Bulletin, Aug. 2000.

"Applications of High Conductivity Traces in Thin Film Circuits," © 1995 MIC Technology Corporation.

Stefan A. Maier, Mark L. Brongersma, and Harry A. Atwater, "Electromagnetic Energy Transport Along Arrays Of Closely Spaced Metal Rods As An Analogue To Plasmonic Devices," Applied Physics Letters, vol. 78, No. 1, Jan. 1, 2001.

T. W. Ebbesen, H. J. Lezec, H. F. Ghaemi, T. Thio & P. A. Wolff, "Extraordinary Optical Transmission Through Sub-Wavelength Hole Arrays", Nature, vol. 391, Feb. 12, 1998.

H. J. Lezec, A. Degiron, E. Devaux, R. A. Linke, L. Martin-Moreno, F. J. Garcia-Vidal, T.W. Ebbesen, "Beaming Light from a Subwavelength Aperture" Sciencexpress, / www.sciencexpress.org / 20 June 2002 / Page 1/ 10.1126/science.1071895.

R. Chang, T. Marks, T. Mason, and K. Poeppelmeier, "n/p-Type Transparent Conductors".

A. P. Li et al. "Polycrystalline Nanopore Arrays with Hexagonal Ordering On Aluminum" 1 J. Vac. Sci. Technol. A, 1428-1431, 17(4) Jul./Aug. (1999).

K. Tennakone et al, "A dye-Sensitized Nano-Porous Solid-State Photovoltaic Cell," Semiconductor Science and Technology, vol. 10, pp. 1689-1693, IOP Publishing, UK 1995. cited by examiner.

Merriam Webster Online Dictionary entry for "substantial" [online], [retrieved on Sep. 15, 2004]. Retrieved from the Internet ,<URL: http://www.m-w.com/cgi-bin/dictionary?book=Dictionary &va=substantially>- ;. cited by other.

Merriam Webster Online Dictionary entry for "template" [online], [retrieved on Jul. 7, 2004]. Retrieved from the Internet ,<URL: http://www.m-w.com/cgi-bin/dictionary?book=Dictionary &va=template>. cited by other.

Merriam Webster Online Dictionary entry for "include" [online], [retrieved on Jun. 14, 2004]. Retrieved from the Internet ,<URL: http://www.m-w.com/cgi-bin/dictionary?book=Dictionary &va=include>. cited by other.

De Tacconi et al, "Semiconductor nanostructures in an alumina template matrix: micro- versus macro-scale photoelectrochemical behavior," Electrochimica Acta, vol. 47, pp. 2603-2613, Apr. 7, 2002. cited by examiner.

Final Office Action of May 25, 2004 for U.S. Appl. No. 10/319,406.

Non-Final Office Action of May 25, 2004 for U.S. Appl. No. 10/319,406.

Interview Summary of Jul. 23, 2004 for U.S. Appl. No. 10/319,406.

Final Office Action of Dec. 15, 2006 for U.S. Appl. No. 10/303,665.

Non-Final Office Action of Jun. 29, 2006 for U.S. Appl. No. 10/303,665.

Non-Final Office Action of Mar. 31, 2006 for U.S. Appl. No. 10/303,665.

Non-Final Office Action of Oct. 20, 2005 for U.S. Appl. No. 10/303,665.

Interview Summary of Jun. 5, 2007 for U.S. Appl. No. 10/290,119.

Advisory Action of Oct. 12, 2006 for U.S. Appl. No. 10/290,119.

Final Office Action of Jul. 27, 2006 for U.S. Appl. No. 10/290,119.

Non-Final Office Action of Dec. 14, 2005 for U.S. Appl. No. 10/290,119.

* cited by examiner

NANOSTRUCTURED TRANSPARENT CONDUCTING ELECTRODE

CROSS-REFERENCE TO AN EARLIER FILED APPLICATION

This application is a continuation-in-part of co-pending U.S. patent application Ser. No. 10/303,665, now U.S. Pat. No. 7,253,017, filed Nov. 22, 2002, and a continuation-in-part of U.S. patent application Ser. No. 10/319,406, now U.S. Pat. No. 6,852,920, filed Dec. 11, 2002. Application Ser. Nos. 10/303,665, 10/319,406 and this application claim priority to U.S. Provisional Patent Application 60/390,904, filed Jun. 22, 2002. This application is also a continuation-in-part of U.S. patent application Ser. No. 10/290,119, now U.S. Pat. No. 7,291,782, filed Nov. 5, 2002. The entire disclosures of applications of Ser. Nos. 10/303,665, 10/319,406, 60/390,904 and 10/290,119 are incorporated herein by reference.

FIELD OF THE INVENTION

This invention generally relates to optoelectronic devices and more particularly to photovoltaic, e.g., solar cell, devices.

BACKGROUND OF THE INVENTION

Conducting glasses are indispensable in many optoelectronic applications, including flat-panel displays, solar electricity cells, diode lasers, and other optoelectronic devices, where they are used both as elements within the device optics and as a transport medium for electrons to move across a device surface. As such, the materials comprising conducting glasses (also called transparent conducting electrodes, or TCEs) require both high transparency and high conductivity for effective function. TCEs are used in a wide variety of specialty and electronic glass products, including both passive applications such as antistatic films, antireflective stacks, electromagnetic shielding, heat-efficient electrochemical windows, and electroluminescent lamps, and active applications such as flat panel displays, light emitting diodes, transparent membrane switches, touch screens, and thin film solar cells.

State-of-the-art for TCE's are based on metal oxides, which are not real conductors and have high sheet resistivities (>6, often 50 or 250 Ohms/□). Current solutions to the challenge of combining transparency with conductivity rely on coating glass with a thin layer of one of a variety of metal oxides, which are transparent and reasonably conductive. Indium Tin Oxide (ITO) and Fluorinated Tin Oxide (F:SnO$_2$) are common materials used in TCE's. The drawback of this approach is that metal oxides are not proper conductors, with sheet resistance typically being at least 5 Ohms/□ for the most expensive products and often more than 60-200 Ohms/□ for lower-priced materials. As a result, there is currently a tradeoff when integrating lower-cost, high-resistivity conducting glasses into optoelectronic devices, with higher resistance translating into significant energy losses in several applications. The alternative strategy of employing significantly more expensive, incrementally more conductive glasses, often with still unsatisfying resistivity, leads to a limited adoption of otherwise market-competitive products.

Thus, expensive TCEs represent a bottleneck in the development of inexpensive optoelectronic products; in many cases, the TCEs are currently the primary cost contributor within a complex device (e.g. solar cells, LEDs).

Therefore, a need exists in the art for a relatively low cost, low resistivity transparent conducting electrode and a corresponding method for making it.

SUMMARY OF THE INVENTION

The disadvantages associated with the prior art are overcome by embodiments of the present invention directed to a transparent conducting electrode, methods for manufacturing such conducting electrodes, optoelectronic devices incorporating such transparent electrodes and methods for making such optoelectronic devices.

According to an embodiment of the invention, a nanostructured transparent conducting electrode includes a nano-architected porous film having a network of interconnected pores and an electrically conductive material that substantially fills the pores. The pores may be substantially uniformly distributed and may have diameters of between about 1 nm and about 100 nm. Neighboring pores may be separated by between about 1 nm and about 100 nm. The electrically conductive material that fills the pores may include one or more metals such as aluminum, copper, gold and silver. The nanostructured transparent conducting electrode may include a layer of transparent conducting material with the nano-architected porous film disposed on the layer of transparent conducting material. The layer of transparent conducting material may include one or more transparent conducting oxides such as indium tin oxide (ITO), tin oxide, fluorinated tin oxide (F:SnO$_2$), zinc oxide, aluminum-doped zinc oxide, fluorine-doped In$_2$O$_3$, and gadolinium indium oxide. The nanostructured transparent conducting electrode may optionally include a substrate with the layer of transparent conducting material may be disposed between the substrate and the nano-architected porous film. The substrate may be made from a transparent material such as a glass or polymer.

According to another embodiment of the present invention, a nanostructured transparent conducting electrode may be fabricated by forming a nano-architected porous film on a layer of transparent conducting material and substantially filling the pores in the nano-architected porous film with an electrically conductive material. In particular, the nano-architected porous film may be fabricated by a temptation technique, e.g., a surfactant temptation technique. On particular surfactant temptation technique, involves disposing on a substrate, a sol containing one or more alkoxides, one or more surfactants, one or more condensation inhibitors, water, and ethanol and evaporating the ethanol from the sol to form a surfactant-templated porous film. The surfactant-templated porous film can be covalently crosslinked to form a mesoporous grid. The electrically conductive material may be a metal. Electrodeposition techniques may be used to fill the pore with the electrically conductive material. During electrodeposition, the layer of transparent conducting material may serve as an electrode that attracts ions from a plating solution.

According to another embodiment of the present invention, an optoelectronic device may incorporate one or more nanostructured transparent conducting electrodes in electrical contact with an active layer. The active layer may include an exciton splitting and charge transporting network. Such a network may include two complementary semiconductor materials, e.g., having different electron affinities. The two complementary semiconductor materials may be in the form of a nanoscale grid network and a network-filling material.

According to another embodiment of the present invention, an optoelectronic device may be made by fabricating a first electrode and disposing an active layer between the first electrode and a second electrode. One or more of the first and second electrodes may be a nanostructured electrode with a nano-architected porous film having interconnected pores on a layer of transparent conducting material and substantially filling the pores with a conducting material.

According to another embodiment of the present invention, nanostructured transparent conducting electrodes may be incorporated into a solar power generation system. Such a system may include an array of photovoltaic cells, wherein one or more cells in the array includes one or more exciton-splitting and charge transporting networks disposed between a first electrode and a second electrode. At least one of the electrodes is a nanostructured electrode having a nano-architected porous film having a network of interconnected pores and an electrically conductive material that substantially fills the pores.

Embodiments of the present invention provide new and useful optoelectronic devices that may be formed relatively inexpensively and on a large scale.

DETAILED DESCRIPTION OF THE INVENTION

Contents

I. Glossary

II. General Overview

III. Nanostructured Transparent Conducting Electrodes

Figure 1A:
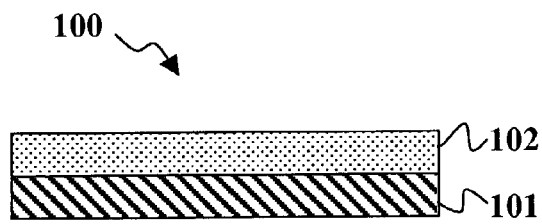
FIG. 1A depicts a transparent conducting electrode (TCE) according to the prior art

IV. Fabrication of Nanostructured Transparent Conducting Electrodes

V. Devices using Nanostructured Transparent Conducting Electrodes

VI. Alternative Embodiments

VII. Conclusion

I. GLOSSARY

The following terms are intended to have the following general meanings as they are used herein:

Device: An assembly or sub-assembly having one or more layers of material.

Semiconductor: As used herein, semiconductor generally refers to a material characterized by an electronic bandgap typically between about 0.5 eV and about 3.5 eV.

Hole-Acceptor, Electron-Acceptor: In the case of semiconductor materials, hole-acceptor and electron-acceptor are relative terms for describing charge transfer between two materials. For two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Complementary charge-transfer properties: As used herein, a first and second semiconductor material are said to have complementary charge-transfer properties with respect to each other when the first material is a hole-acceptor with respect to the second and the second is an electron-acceptor with respect to the first or vice versa.

Nano-Architected Porous Film: As used herein "nano-architected porous film" generally refers to a film of material having features characterized by a width, or other characteristic dimension, on the order of several nanometers ($10^{-9}$ m) across. Nano-architected porous films may be produced by several techniques, including:

(a) Intercalation and/or grafting of organic or polymeric molecules within a mineral lamellar network comprised of clays, phosphates, phosphonates, etc. The lamellar compounds serve as a network host which preserves the pre-established structural order. Organic molecules are then inserted or grafted into this pre-structured network (which is comprised of mineral(s)).

(b) Synthesis by electrocrystallisation of hybrid molecular assemblies. This synthesis technique drives the construction of highly organized mineral networks with relatively long-range order that can be controlled and adjusted for electronic intermolecular transfer.

(c) Impregnation of preformed inorganic gels. In an example of this technique, a silica xerogel can be formed by hydrolysis and polycondensation of silicon alkoxides with organic monomers (e.g. with monomers that are susceptible to polymerization within the porous gel structure). Methylmethacrylate (MMA) is an example of a suitable organic monomer and the inorganic-organic hybrid obtained after polymerization of the MMA has optical and mechanical properties often superior to the individual components.

(d) Synthesis from heterofunctional metallic alkoxides metallic halides or silsesquioxannes: Precursors of this kind have the formula $R_xM(OR')_{n-x}$ or $3(R'O)Si-R''-Si(OR')3$, where R and R' are either hydrogen (H), any organic functional group or a halide, R'' can be oxygen or an organic functional group, and M is a metal. Typically R and R' involve oxygen, e.g., —O—R and —O—R'. M may be any transition metal, e.g., titanium, zinc, zirconium, copper, lanthanum, niobium, strontium, or silicon, etc. The hydrolysis of alkoxy groups (OR') followed by a condensation reaction will form the mineral network and the R groups will imprint in the network the organic function.

(e) Synthesis of hybrid networks through the connection of well-defined functional nanobuilding Blocks. The pre-formatted species or building blocks could be in this case oxo-metallic clusters, nanoparticles (CdS, CdSe, ... ), metallic or oxides colloids, organic molecules or oligomers. These blocks are functionalized during or after their synthesis with complementary species for tailoring the interface between organic and inorganic domains. A review of this strategy has been presented in Comments in Inorganic Chemistry 20(4-6), 327-371 (1999), which is incorporated herein by reference.

(f) Templated growth of inorganic or hybrid networks by using organic molecules and macromolecules as structure directing agents. In general, molecules like amines, alkyl ammonium ions, amphiphilic molecules or surfactants can be used as templates to build a structured mineral network. Materials of the zeolites families are among the most intensively investigated systems. Molecular and supramolecular interactions between template molecules (surfactants, amphiphilic block copolymers, organogelators, etc. ... ) and the growing hybrid or metal-oxo based network permit the construction of complex hybrid hierarchical architectures.

(g) Templated growth using nanoparticles, instead of surfactants followed by removal of the nanoparticles, leaving behind a porous network. The nanoparticles may be made, e.g., of latex, and removed, e.g., by heating the templated film to a sufficient temperature to "burn off" the nanoparticles.

Surfactant Templation: In general, surfactant temptation is a particular subcategory of templated growth. As used herein, surfactant temptation refers an approach toward achieving pore size control of inorganic or organic frameworks, e.g., by using surfactants or block copolymers as templates to build a structured mineral network. Surfactant temptation may be used to prepare a high-porosity surfactant-templated porous thin film. Surfactant temptation includes the sol-gel approach described below.

Optoelectronic Device: A device that interacts with radiation and electric current. Such a device could be a radiation-emitting device, e.g. a light-emitting diode (LED) or laser, or a radiation absorbing device, e.g. a photodetector/counter, photovoltaic cell (solar cell) or radiation-driven electrolysis cell.

Solar Cell: A photovoltaic device that interacts with radiation (often in the form of sunlight) impinging on the device to produce electric power or voltage.

Organic Solar Cell: A type of solar cell wherein an active photoelectric layer is fabricated, either partly or entirely, using organic materials comprising, e.g., polymers, dyes, pigments (including mixtures) that are predominantly carbon based compounds. These materials may be insulating, conductive or semiconductive.

Radiation: Energy which may be selectively applied including electromagnetic energy having a wavelength between $10^{-14}$ and $10^4$ meters including, for example, gamma radiation, x-ray radiation, ultraviolet radiation, visible light, infrared radiation, microwave radiation and radio waves.

Material: The term "material" is used herein to refer to solid-state compounds, extended solids, extended solutions, clusters of molecules or atoms, crystals, polymers, dyes, particularly including conjugated polymers and dyes.

Inorganic Materials: Materials which do not contain carbon as a principal element. The oxides and sulphides of carbon and the metallic carbides are considered inorganic materials. Examples of inorganic compounds include, but are not restricted to, the following:

(a) Intermetallics (or Intermediate Constituents): Intermetallic compounds constitute a unique class of metallic materials that form long-range ordered crystal structures below a critical temperature. Such materials form when atoms of two metals combine in certain proportions to form crystals with a different structure from that of either of the two metals (e.g., NiAl, $CrBe_2$, CuZn, etc.).

(b) Metal Alloys: A substance having metallic properties and which is composed of a mixture of two or more chemical elements of which at least one is a metal.

(c) Magnetic Alloys: An alloy exhibiting ferromagnetism such as silicon iron, but also iron-nickel alloys, which may contain small amounts of any of a number of other elements (e.g., copper, aluminum, chromium, molybdenum, vanadium, etc.), and iron-cobalt alloys.

(d) Inorganic polymers such as polysilanes or other non-carbon based polymers or monomers.

(e) Ceramics: Typically, a ceramic is a metal oxide, boride, carbide, nitride, or a mixture of such materials. Examples of such materials include, among others, alumina, zirconia, Titania ($TiO_2$) silicon carbide, aluminum nitride, silicon nitride.

Organic Materials: Compounds, which principally consist of carbon and hydrogen, with or without oxygen, nitrogen or other elements, except those in which carbon does not play a critical role (e.g., carbonate salts). Examples of organic materials that can be synthesized using the methods of the present invention include, but are not restricted to, the following:

(a) Organic Dyes and pigments such as perylenes, phthalocyanines, merocyanines, terylenes and squaraines and their derivatives.

(b) Polymers: Materials consisting of large macromolecules composed of more than one repeating units. Polymers, composed of 2-8 repeating units are often referred to as oligomers.

Examples of such repeating units include, e.g., dyes or pigments. Polymers can be natural or synthetic, cross-linked or non-crosslinked, and they may be homopolymers, copolymers, or higher-ordered polymers (e.g., terpolymers, etc.). Examples of polymers include, but are not limited to, the following: polyurethanes, polyesters, polycarbonates, polyethyleneimines, polyacetates, polystyrenes, polyamides, polyanilines, polyacetylenes, polypyrroles, conjugated polymers, (e.g., semiconductive polymers such as polyphenylvinylene, polythiophene, polyfluorenes, polyparaphenylene and polymers containing $C_{60}$ or dyes such as perylenes or phthalocyanines) or conductive polymers such as doped PEDOT (Baytron), polyaniline or polyacetylene. These may be doped and may be synthesized or grafted onto one another using either classical organic chemistry techniques or using enzymes to catalyze specific reactions.

II. GENERAL OVERVIEW

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Compared to highly conductive films, poorly conducting films can be produced at relatively low cost. In view of this, an advanced form of transparent conducting electrode (TCE) has been developed where a highly conductive transparent film can be made at low cost starting from a relatively inexpensive poorly-conducting transparent film. This advanced form of TCE has a wide range of uses across several classes of specialty and electronic glass applications. In embodiments of the present invention, tunable, inexpensive, highly conductive and transparent films can be synthesized using a nano-architected porous film containing an embedded matrix of finely-nanostructured conducting material, e.g., metal. To the inventors' knowledge, this is the first time that glass has been combined with a real conductor in the form of a network of ordered, regularly arranged interconnected nanostructures embedded directly in the glass.

The regular ordered nanoporous nature of nano-architected porous films provides a relatively inexpensive means to uniformly embed a nanostructured metallic network within a glass coating without adversely impacting optical transparency. The metallic component provides a means to efficiently transport electrons across the glass surface. This facilitates the production of inexpensive, environmentally stable, and highly conductive transparent electrodes for use in many device applications.

Embodiments of the present invention have several advantages over previous transparent electrodes. Such advantages include relatively low sheet resistance, relatively low cost and more convenient manufacture compared to prior art transparent electrodes.

III. NANOSTRUCTURED TRANSPARENT CONDUCTING ELECTRODES

For the purpose of comparison, FIG. 1A depicts a conventional transparent conducting electrode 100 includes a glass or plastic substrate 101 and an transparent conducting layer 102. Embodiments of the present invention improve on the prior art through the use of nanostructured materials in transparent conducting electrodes.

Figure 1B:
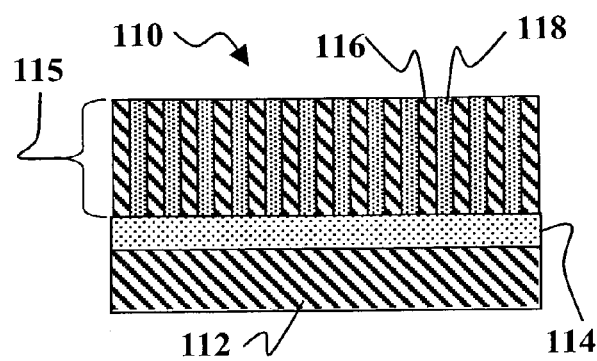
FIG. 1B depicts a nanostructured TCE according to an embodiment of the present invention.

FIG. 1B depicts a schematic diagram of a nanostructured transparent conducting electrode 110 according to an embodiment of the present invention. The transparent conducting electrode 110 includes an optional substrate 112, a layer of transparent conducting material 114 and a nanostructured layer 115. The substrate 112 may be made from any suitable transparent material, such as a glass or polymer material. The substrate 112 provides a surface that supports the transparent conducting layer 114. The transparent conducting layer 114 may be made from a conventional transparent conducting oxide such as tin oxide ($SnO_2$), indium tin oxide (ITO), fluorinated tin oxide ($F:SnO_2$), zinc oxide (ZnO), aluminum-doped zinc oxide, fluorine-doped $In_2O_3$, and gadolinium indium oxide. The nanostructured layer 115 includes an ordered network of interconnected conducting structures, e.g., in the form of a nano-architected porous film 116 having a network of interconnected pores and a conducting material 118 that fills pores in the nano-architected porous film 116. The nanostructured transparent conducting electrode 110 can be configured to transmit radiation within a desired range of frequencies, e.g., by appropriately adjusting the diameter, spacing and interconnection of the conducting material 118. In general, the nanostructured conducting electrode 110 may have a resistivity of between about $10^{-6}$ Ωcm and about 250 Ωcm, more preferably between about $10^{-6}$ Ωcm and about 50 Ωcm, even more preferably between about $10^{-6}$ Ωcm and about 10 Ωcm and most preferably between about $10^{-6}$ Ωcm and about 1 Ωcm.

Figure 1C:
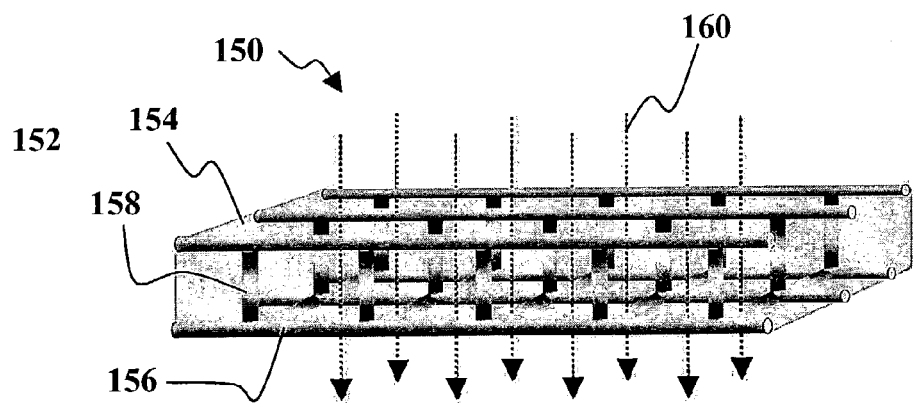
FIG. 1C depicts a schematic diagram of a nanostructured conducting network embedded within a nano-architected porous film, according to an embodiment of the invention.

Interconnection between the conducting structures facilitates conduction both perpendicular to and within in the plane of the nanostructured layer 115. FIG. 1C depicts an isometric schematic diagram of an example of the nanostructured layer 150 illustrating one possible interconnection scheme that may be used in transparent conducting electrode of the type shown in FIG. 1B. The nanostructured layer 150 includes a conducing network 152 embedded within a nano-architected transparent porous coating 154. The conducting network 152 may include interconnected metal nanowires 156 that conduct electrons substantially parallel to the plane the nanostructured layer 150. The nanowires 156 may interconnect with columns 158 that conduct electrons substantially perpendicular to the plane of the nanostructured layer 150. By appropriately selecting the diameter and spacing of the nanowires 156 and columns 158, radiation 160 may penetrate the nanostructure layer 150. A nanostructured layer 150 of the type shown in FIG. 1C can provide both high radiation transmission and low electrical resistance. Furthermore, a nanostructured layer 150 of the type shown in FIG. 1C can serve as a stand-alone transparent electrode without a substrate or layer of conventional transparent conducting material.

The nano-architected porous film 116 may have regularly spaced pores roughly 1 nm to 100 nm (more preferably 2 nm to 50 nm) in diameter where neighboring pores are between about 1 nm and about 100 nm (more preferably 2 nm to 50 nm) apart measured, e.g., from nearest edge to nearest edge. The pores are preferably interconnected with each other and accessible from the transparent conducting layer 114 and any overlying layer. Such a porous nano-architected film may be a surfactant templated porous film. One approach to construct such a surfactant-templated porous film is to use sol-gel based self-assembly of porous nanofilms to construct a mold having 1-100 nm diameter pores spaced 1-100 nm apart. The pores in the nano-architected porous film 116 may be filled with the conducting material 118 by any suitable means, e.g., by electrodeposition. To reduce unwanted absorption of radiation, the spacing of the pores in the nano-architected porous film 116 is desirably less than the shortest wavelength of the radiation to which the transparent conducting electrode 110 is to be made transparent.

Where the pores are to be filled by electrodeposition, the transparent conducting layer 114 need not be and desirably is not of high quality in terms of resistivity and defects. Using a poor quality transparent conducting layer, e.g., ITO, as a substrate is actually advantageous, in that low conductivity creates better controllable electrodeposition conditions for filling the pores in the nano-architected porous film 116. Furthermore poor quality transparent conducting films often have many microstructural defects, which is part of the reason they are poor conductors. Coating such a low-quality transparent conducting layer with a nanostructured conducting film in effect "buffers" this underlying surface landscape. In particular, sol-gel condensation processes are very defect tolerant and can form a uniform film on a non-uniformly microstructured substrate.

IV. FABRICATION OF NANOSTRUCTURED TRANSPARENT CONDUCTING ELECTRODES

Nanostructured transparent conducting electrodes of the types described above may be manufactured in accordance with an inventive method. An example of an embodiment of such a method is 200 illustrated generally by the flow diagram of FIG. 2 and the series of schematic diagrams shown in FIGS. 3A-3D.

Figure 3A:
FIGS. 3A-3D depict a series of schematic diagrams illustrating the fabrication of a nanostructured TCE according to the flow diagram of FIG. 2.
Figure 3B:
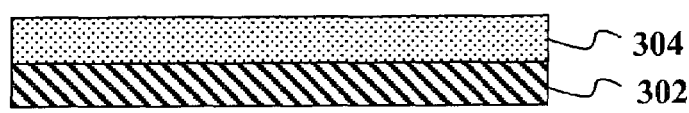

In the example shown in FIGS. 3A-3D, the nanostructured TCE may be build up from a transparent substrate 302, as shown in FIG. 3A. The substrate 302, may be made from any suitable transparent material e.g. glass or a plastic polymer such as PET (Mylar). The method 200 may begin at 202 by forming a transparent conducting layer 304 on the substrate 302 as shown in FIG. 3B. The transparent conducting layer 304 may be formed, e.g. by depositing transparent conducting material, such as indium-tin-oxide (ITO) or its equivalent, on the substrate 302.

Figure 3C:
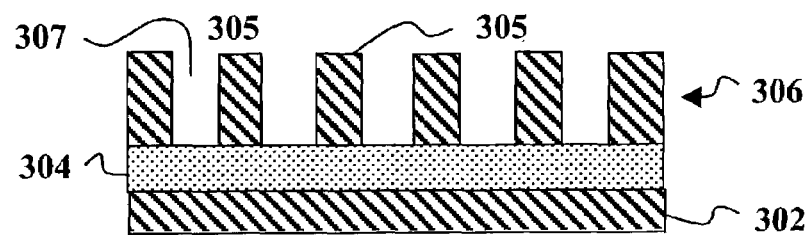
Figure 3D:
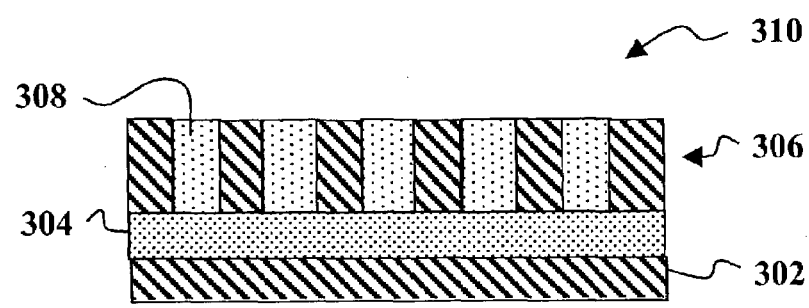
Figure 5:
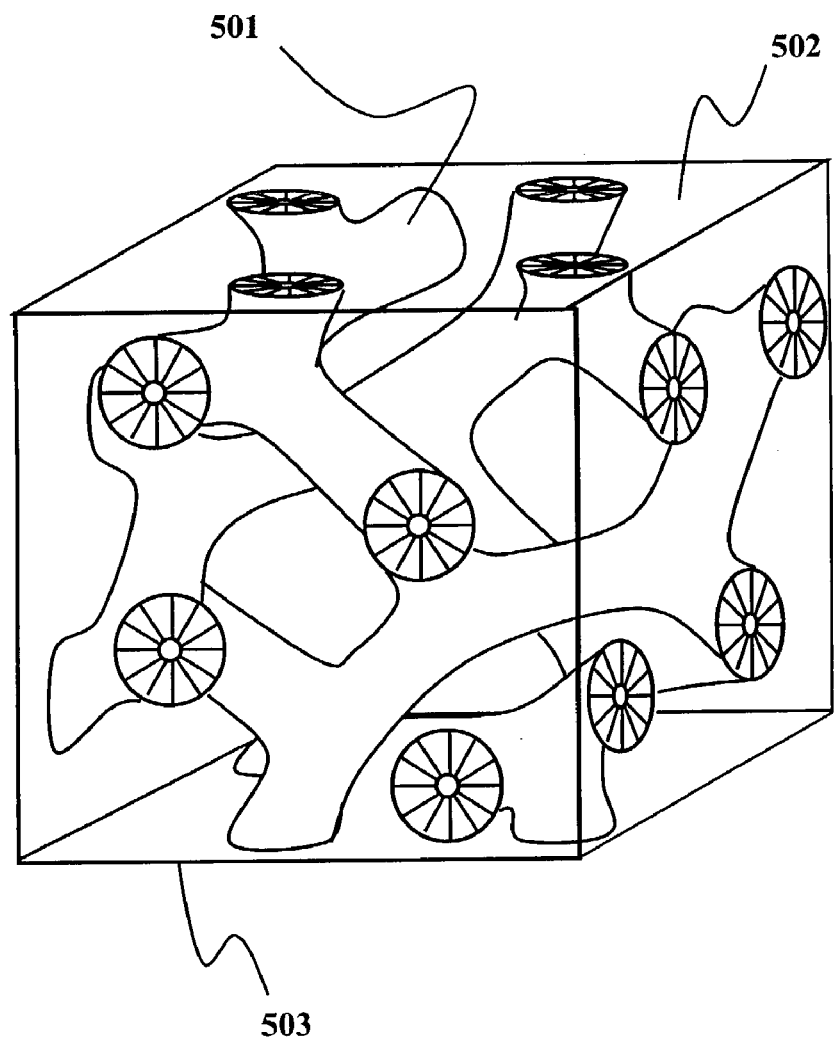
FIG. 5 depicts an isometric close-up view of a portion of a possible porous film structure.

Subsequently, at 204, a nano-architected porous film 306 having a network of interconnected pores 307 is formed on the transparent conducting layer 304 as shown in FIG. 3C. Such a nano-architected porous film may be formed, e.g., by surfactant temptation techniques. The configuration of the pores 307 is shown in simplified form for the sake of clarity. Although the pores 307 may be aligned substantially parallel to each other as shown in FIGS. 3B-3D, the pores 307 are preferably interconnected and accessible from the transparent conducting layer 304 and any layer in contact with an exposed surface 305 of the nano-architected porous film 306. Furthermore, the pores 307 are preferably interconnected such that they provide a network of paths within the plane of the nano-architected porous film. One example, among others, of a possible configuration of the pores 307 is shown in FIG. 5.

By way of example, the nano-architected porous film 306 may be made from oxides, such as silicon dioxide ($SiO_2$) or zinc oxide (ZnO). Alternatively, metal oxides, such as Titania ($TiO_2$) may be used. The nano-architected porous film 306 may be a made, e.g., using a variety of surfactant temptation techniques such as evaporation induced self-assembly, etc. Precursors for the template film 306 may be coated on the transparent conducting layer 304, e.g. by web-coating, dip-coating, spin-coating or spray coating based deposition. By appropriate choice of the coating parameters, the porous template film 306 can be formed such that the pores 307 are roughly 2 nm to 100 nm in diameter and neighboring pores are between about 2 nm and about 100 nm apart. The porous template film 306 may be subsequently dried and annealed.

At 206, the pores 307 are filled with an electrically conducting material 308, as shown in FIG. 3D to form a finished nanostructured transparent conducting electrode 310. The conducting material 308 may be made include metals, such as copper, aluminum, silver, etc, alloys of such metals, intermetallics, conducting metal-oxides or conducting polymers (e.g., conjugated polymers). The conducting material 308 may be deposited in the pores by any suitable technique, including electrodeposition, chemical bath deposition, or pore infiltration by capillary action.

It is possible to produce a stand-alone nanostructured transparent conducting electrode of the type shown in FIG. 1C by proceeding as described above and separating the nano-architected porous film 306 from the layer of conventional transparent conducting material 304 and/or substrate 302 after the pores have been filled with conducting material 308.

A. Forming the Transparent Conducting Layer

Figure 2:
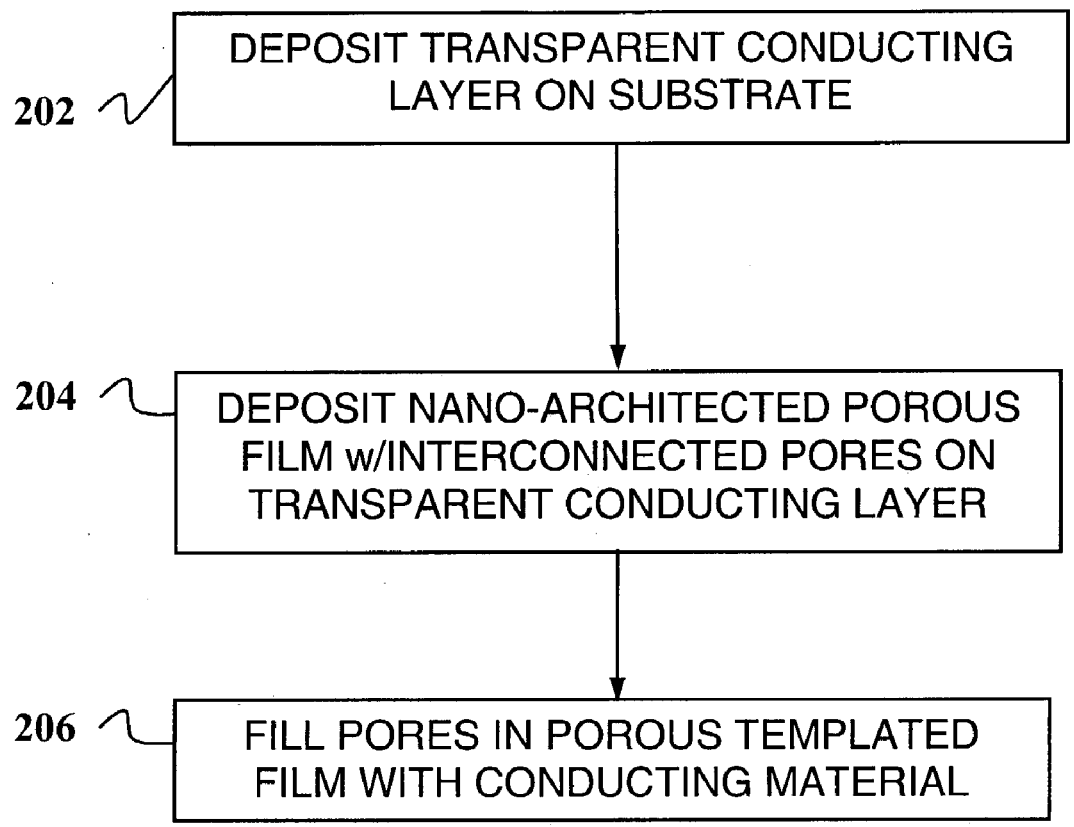
FIG. 2 depicts a flow diagram illustrating an example of a method for making a nanostructured TCE according to an embodiment of the present invention.

With respect to step 202 of FIG. 2, and FIG. 3B, the transparent conducting layer may be formed with or without the substrate by any suitable means. In a particular example, the substrate 302 may be made of glass and the transparent conducting layer 304 may be formed by sputter coating a transparent conducting oxide (TCO) such as indium tin oxide (ITO) onto the surface of the substrate 302. Other suitable transparent conducting oxides that may be sputtered include tin oxide, fluorinated tin oxide ($F:SnO_2$), zinc oxide, aluminum-doped zinc oxide, fluorine-doped $In_2O_3$, and gadolinium indium oxide.

Transparent conducting oxides, such as ITO, are typically deposited in a manufacturing environment by means of dc-magnetron sputtering. The choice of target—ceramic or metal—depends on the film quality sought and the process control available. The variables adjusted during process optimization include oxygen partial pressure, total gas pressure, residual water-vapor partial pressure, substrate and target temperature (due to unintended heating), sputter power, and target composition and configuration. For low resistivity, the ITO may be sputtered deposited on a hot (300° C.-400° C.) substrate or deposited on a cold and annealed, e.g., at about 200° C. in an oxygen-controlled atmosphere.

For prior art optoelectronic applications, the transparent conductor had to be carefully processed to maximize optical transmissivity in the visible regime, while achieving minimum electrical resistivity. Optimization of these properties depends on the application, but in general, achieving the required performance in the as-deposited condition requires careful process control. In the prior art, such careful processing was directed at the minimization of microstructural features and impurities that lead to reduced electron mobility, the maximization of activated substitutional Sn, and the creation of optimal oxygen substoichiometry. The oxygen stoichiometry was regarded as critical to the minimization of resistivity, since each doubly charged oxygen vacancy contributes two free electrons. Further details of transparent conducting oxides are described by Brian G. Lewis and David C. Paine in "Applications and Processing of Transparent Conducting Oxides," MRS Bulletin, August 2000, which is incorporated herein by reference.

In embodiments of the present invention, the resistivity of the transparent conducting layer 304 can be relatively large. Furthermore, the transparent conducting layer 304 can contain a relatively large number of microstructural defects, compared to the prior art, without significantly compromising the quality of the final nanostructured transparent conducting electrode. Therefore, the processing need not be as carefully controlled and, consequently, not as expensive. Furthermore, some TCO's such as $SnO_2$ may be deposited on the substrate 302 by chloride-based spray pyrolysis. It is also possible to form ITO coatings by spin coating a water-based powdered ITO suspension. Although the electrical conductivity of the films produced in this manner is not as good as with sputtered ITO that is not necessarily a disadvantage here and may in fact be advantageous. Furthermore, deposition by pyrolysis or spin coating is more convenient and economical than magnetron sputtering.

B. Fabrication of Porous Template Film

With respect to step 204 of FIG. 2, there are several approaches to forming the porous nano-architected film described above. One such approach, among others, involves templated growth of inorganic or hybrid networks, e.g., by surfactant temptation. Examples of surfactant-templation techniques for producing porous films are described, e.g., by Brinker, et al in U.S. Pat. No. 6,270,846, the disclosures of which are incorporated herein by reference. One particular surfactant-templation approach, among others, utilizes evaporation-induced self-assembly (EISA) to form a meso-organized liquid-crystal template. This process has been well developed for the fabrication of porous silica, where the substrate is first coated with siloxane and surfactants in an ethanol solution. As the ethanol evaporates over a short time (typically 60-120 seconds), the molecules within the siloxane-surfactant micelle rearrange themselves to minimize their collective energy level. This process continues as the molecules further rearrange their nanoscale organization into highly regular liquid-crystalline mesophases. The resulting porous films contain a high and tunable density of regular, interconnected pores spaced in repeating patterns, with pores neighboring pores spaced approximately 5 nm apart and with pore diameters of about 5 nm, dependant on the choice of surfactant. This nanoscale architecture is highly reproducible, and can be permanently fixed by heating. The resulting nanofilm is extremely stable and mechanically robust. Pore diameter and pore spacing may be adjusted by (1) choice of surfactant, (2) concentration of surfactant, (3) the use of block co-polymers, (4) temperature, (5) humidity level, (6) deposition procedure and speed, (7) concentration of siloxane, (8) use of a cosolvent, (9) use of swelling agents or some combination of two or more of (1), (2), (3), (4), (5), (6), (7), (8) and (9).

Figure 4:
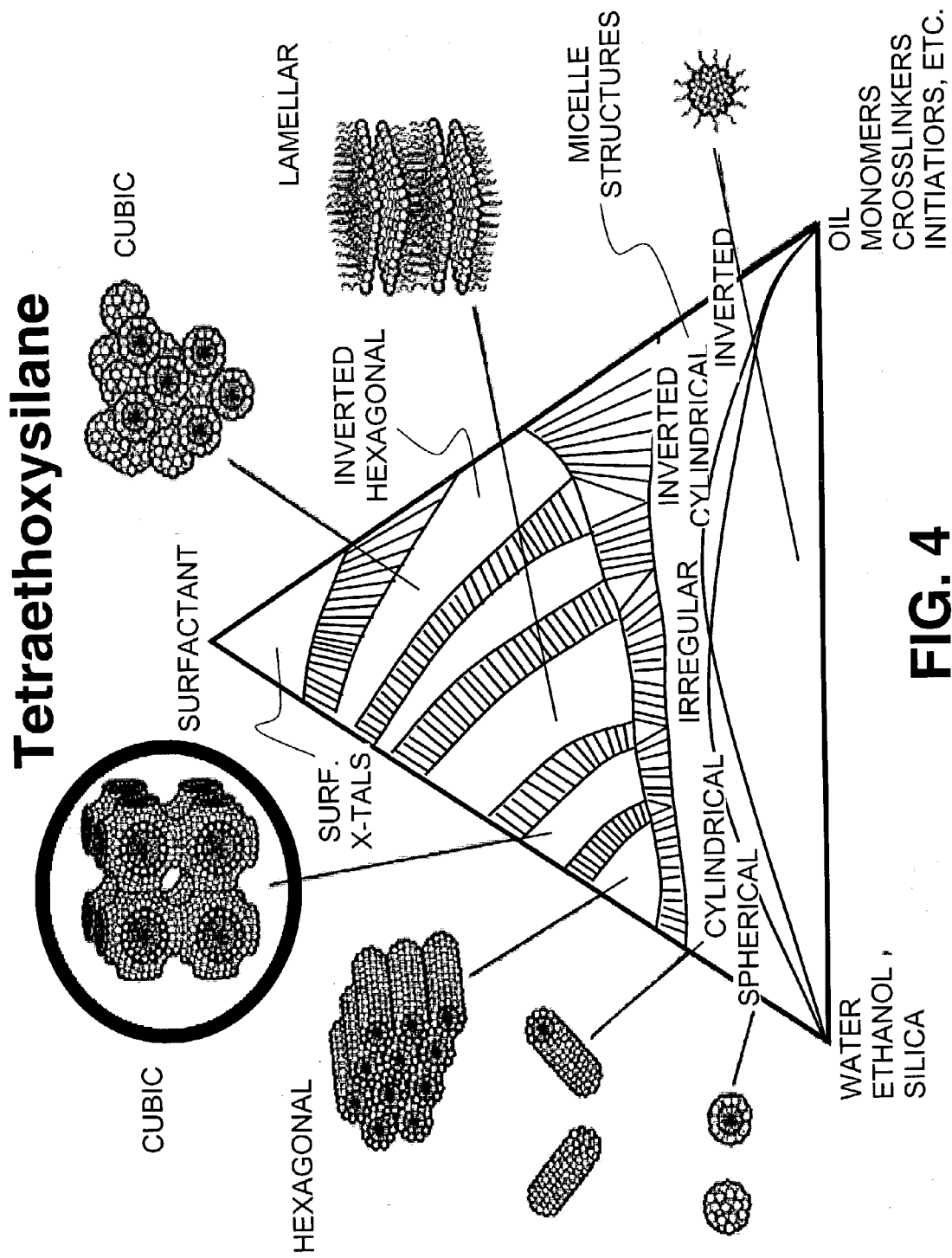
FIG. 4 depicts a ternary phase diagram representing the synthesis of a variety of architectures within a porous film.

FIG. 4 depicts a ternary phase diagram representing the formation of a variety of architectures within a porous film. The structure circled in FIG. 4 depicts a simplified and somewhat idealized diagram of a desirable morphology for the nano-architected porous film. A possible variation of this morphology is shown in FIG. 5, which depicts a portion of a surfactant-templated porous film 500. The film 500 has numerous pores 501 that are interconnected with each other. Furthermore, the pores 601 provide a continuous path, through one or more pores, between a first surface 502 and a second surface 503. The path through the pores 501 provides access to the pores from a layer overlying or a layer underlying the surfactant-templated porous film 500. When the pores are filled with a semiconducting or conducting pore-filling material, charges have a path to migrate through the pore filling material from the overlying layer to the underlying layer and/or vice versa.

In one embodiment, among others, the porous template film is fabricated using a precursor sol. To synthesize the sol, mixtures of one or more alkoxides, one or more surfactants one or more condensation inhibitors, water, and ethanol are combined. In one embodiment, among others, the surfactant is a molecule wherein n is 20 and m is 70.

Examples of suitable alkoxides include polysiloxanes such as tetraethylorthosilicate (TEOS). Examples of suitable surfactants include $HO(CH_2CH_2O)_n(CH_2CHCH_3O)_m(CH_2CH_2O)_nH$, where the subscripts m and n are integers. A particular surfactant of this type is the block copolymer poly (ethyleneoxide)-b-poly(propyleneoxide)-b-poly(ethyleneoxide) (EO20-PO70EO20), sometimes known commercially as Pluronic P123. For Pluronic P123, n=20, m=70, n=20 and the nominal molecular weight is 5750 g/mol. Other suitable surfactants include hexadecyl trimethylammonium bromide (CTAB), polyoxyalkylene ether (e.g. Pluronic F127), and poly(oxyethylene) cetyl ether (e.g., Brij56 or Brij58) Pluronic is a registered trademark of BASF Corporation of Ludwigshafen, Germany. Brij is a registered trademark of Atlas Chemicals of Wilmington Del.

For Pluronic F127, which is a triblock copolymer (PEO-PPO-PEO, having an n-m-n ratio of EO97PO69EO97, i.e., n=97, m=69, n=97. The nominal molecular weight for Pluronic F127 is 12,600 g/mol. F127 is a difunctional block copolymer surfactant terminating in primary hydroxyl groups. It is a nonionic surfactant.

Brij 56 is polyoxyethylene 10 cetyl ether. Brij 58 has several synonyms, including poly(oxyethylene) cetyl ether, poly (oxyethylene) palmityl ether, polyethylene oxide hexadecyl ether, and polyethylene glycol cetyl ether.

Examples of suitable condensation inhibitors include acids such as hydrochloric acid (HCl), sulfuric acid ($H_2SO_4$), nitric acid ($HNO_3$), etc., bases such as sodium hydroxide (NaOH), triethylamine, etc., and chelating agents, including acetyl acetone, alcohol amines, peroxides, etc.

Generally speaking, the molar ratios of the surfactant, condensation inhibitor, ethanol and water may be in the following ranges with respect to X, where X refers to the central element or inorganic network atom, e.g., Ti, Zr, Zn, Si, etc. in the alkoxide::

[Surfactant]/[X]: a molar ratio ranging from about $1 \times 10^{-7}$ to about 0.1

[Ethanol]/[X]: a molar ratio ranging from about 3 to about 20

[Condensation Inhibitor]/[X]: a molar ranging ratio from about $1 \times 10^{-5}$ to about 5

[water]/[X]: a molar ratio ranging from about 1 to about 20.

By way of example, a precursor sol for a porous template of $SiO_2$ may be prepared from TEOS, a polar organic solvent, water and an acid, a hydrophobic compound such as polypropylene oxide (molecular weight of approximately 2000) and a surfactant, such as a polyoxyethylene ether or P123. The polar organic solvent can be any solvent that solubilizes the other reactants, particularly such solvents as alcohols, and more particularly, methanol, ethanol, propanol, butanol, tetrahydrofuran, and formamide or mixtures thereof. An initial silica sol may be prepared by refluxing TEOS, ethanol, water and an acid, such as HCl, at approximately 60° C. By way of example, the molar ratio of the TEOS, ethanol and acid may be about $1:3.8:1.5 \times 10^{-5}$. The sol may be cooled to room temperature and surfactant, $CH_3(CH_2)_{15}(OCH_2CH_2)_{10}OH$, in amounts ranging from 0.6 g to 1.0 g, and the polymer, polypropylene oxide (PPO), in amounts ranging from approximately 0 g to 1.2 g, may be added to 5 mL of the sol, along with 0.8 mL of 1N HCl. The sols may be filtered and a thin film prepared from this solution by spin-coating, web-coating, dip-coating, spray-coating, ink-jet printing, etc. onto a substrate. During the coating procedure, evaporation of the solvent causes the formation of surfactant-stabilized polypropylene microemulsions incorporated into a surfactant-templated silica material. The as-coated films must be crosslinked to form a mesoporous grid and may be heated to approximately 400° C. to 450° C. for approximately 3 hours to remove surfactant and polypropylene oxide templates. Incubation temperature, ramp rate and total incubation time may be varied to optimize the properties of the film.

After incubation of the sol mixture, a substrate, e.g., the starting substrate (e.g., ITO-coated glass or PET), is dipped in the mixture and removed e.g., using an automated, custom-built dip coating apparatus or a commercially available web coating system. Upon removal from the sol, preferential ethanol evaporation concentrates the sol in water, non-volatile surfactant, and the TEOS component thereby forming a $SiO_2$ surfactant-templated porous film. The progressive increase in surfactant concentration drives the self-assembly of metal-alkoxide-surfactant micelles and their further organization into liquid-crystalline mesophases.

The highly-ordered structure of the resulting liquid crystallites can be permanently fixed through exposure to heat. After pattern deposition and drying, the surfactant templates can be selectively removed by annealing the surfactant templated porous film at a temperature (e.g., about 170° C. to about 400° C.) that is sufficient to covalently crosslink the mesoporous matrix and/or is sufficient to decompose the surfactant molecules while remaining within the thermal stability range of the underlying ITO-coated glass or ITO-coated Mylar substrate. The annealing time depends, partly, on the annealing temperature. In general, the high the temperature, the shorter the time and vice versa. An annealing temperature of about 250° C. or higher is preferable as this temperature serves both to covalently cross-link the matrix and to pyrolyze the surfactant out of the matrix within a relatively short time. Once the sol has been cross-linked to itself and the substrate, any remaining surfactant may be removed by heating at more than about 350° C. or by soaking the substrate in ethanol or another appropriate solvent. Alternatively, the film may be annealed for a shorter time at a higher temperature or for a longer time at a lower temperature. Furthermore, either as an alternative to annealing, or in conjunction with annealing, the surfactant template may be exposed to energetic radiation, such as ultraviolet (UV) radiation, to facilitate crosslinking of the grid to form a mesoporous grid and to destroy the structure of the surfactant and make it easier to wash out.

The annealing preferably occurs before the deposition of any conducting material into the porous template film (step 206 discussed below), as it is this initial step that creates the porous structure. Thus any semiconducting material to be deposited in a later step will not be affected by the annealing of the porous Titania film in this prior step.

Figure 6:
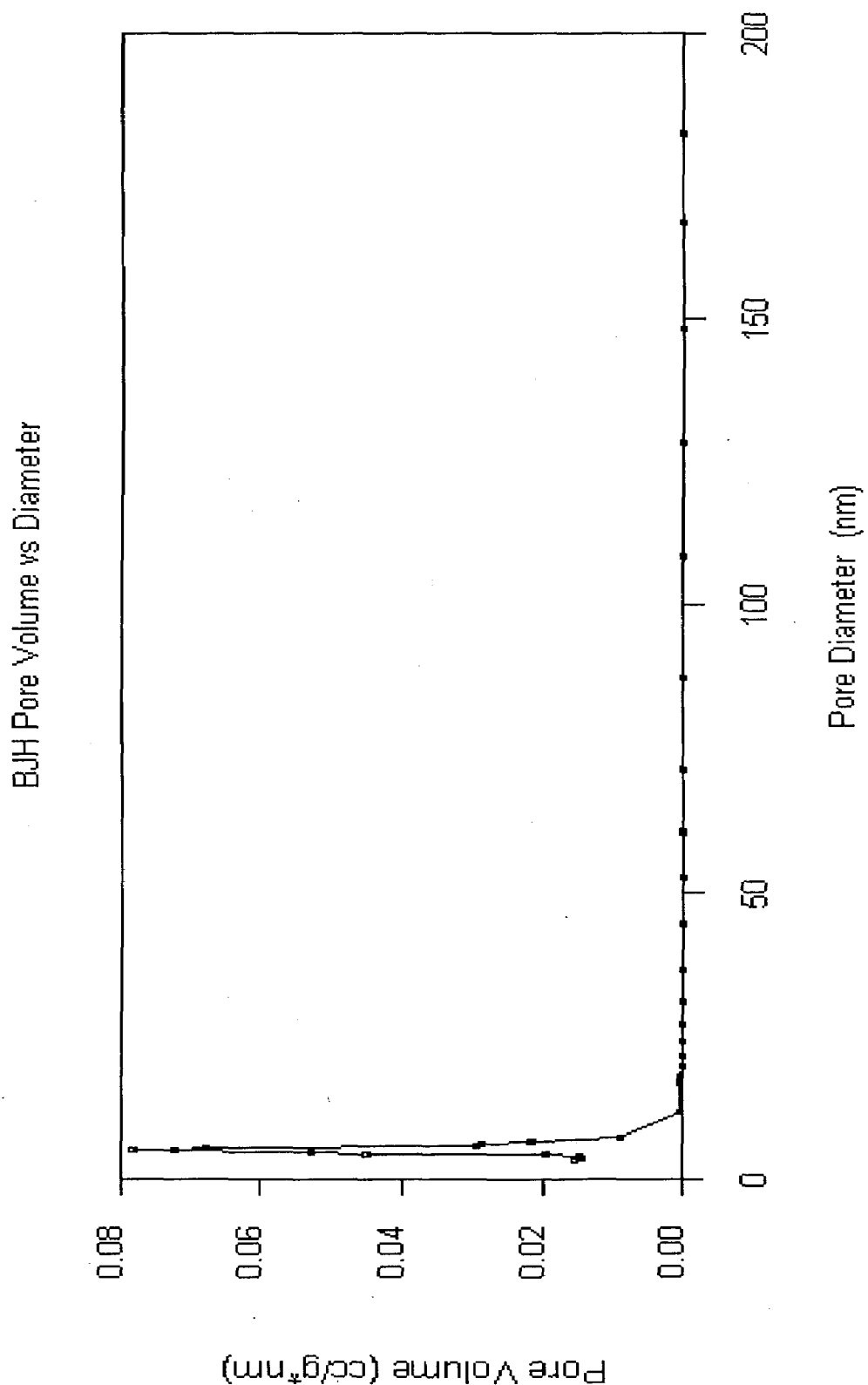
FIG. 6 depicts a graph of pore area vs. pore diameter for a nano-architected porous film.

The properties of the nano-architected porous film 306, e.g., pore size and surface area, may be confirmed by $N_2$ gas adsorption isotherms. FIG. 6 shows data depicting the distribution of pore sizes in porous films created using the protocol described above. The graph in FIG. 6 plots pore area vs. pore diameter for a F127 templated polysiloxane porous film. Solutions containing F127 surfactant and polysiloxane were dropcast, dried, and annealed at 400° C. for two hours. A narrow distribution of pore sizes clustered around 6 nm shows that the pore structure is relatively uniform within the film, and that this structure can be successfully measured using $N_2$ adsorption isotherms.

Figure 7A:
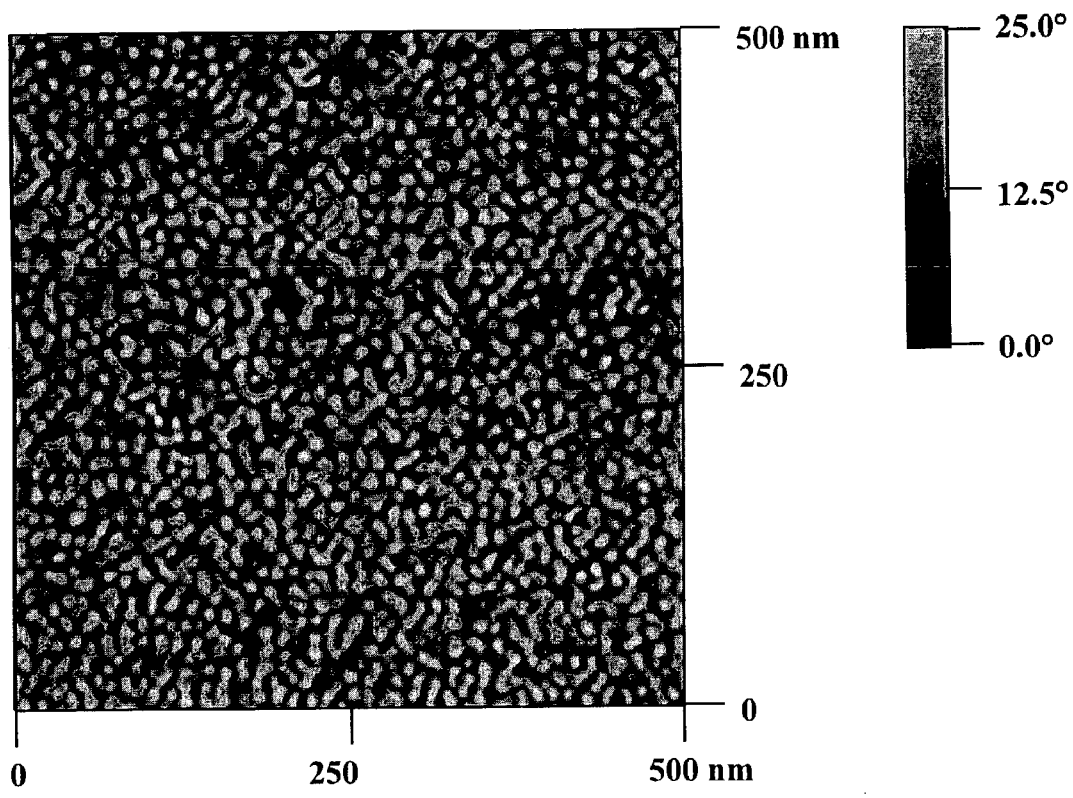
FIGS. 7A-7B depict atomic force micrographs of an example of a nano-architected porous film suitable for use with embodiments of the present invention.
Figure 7B:
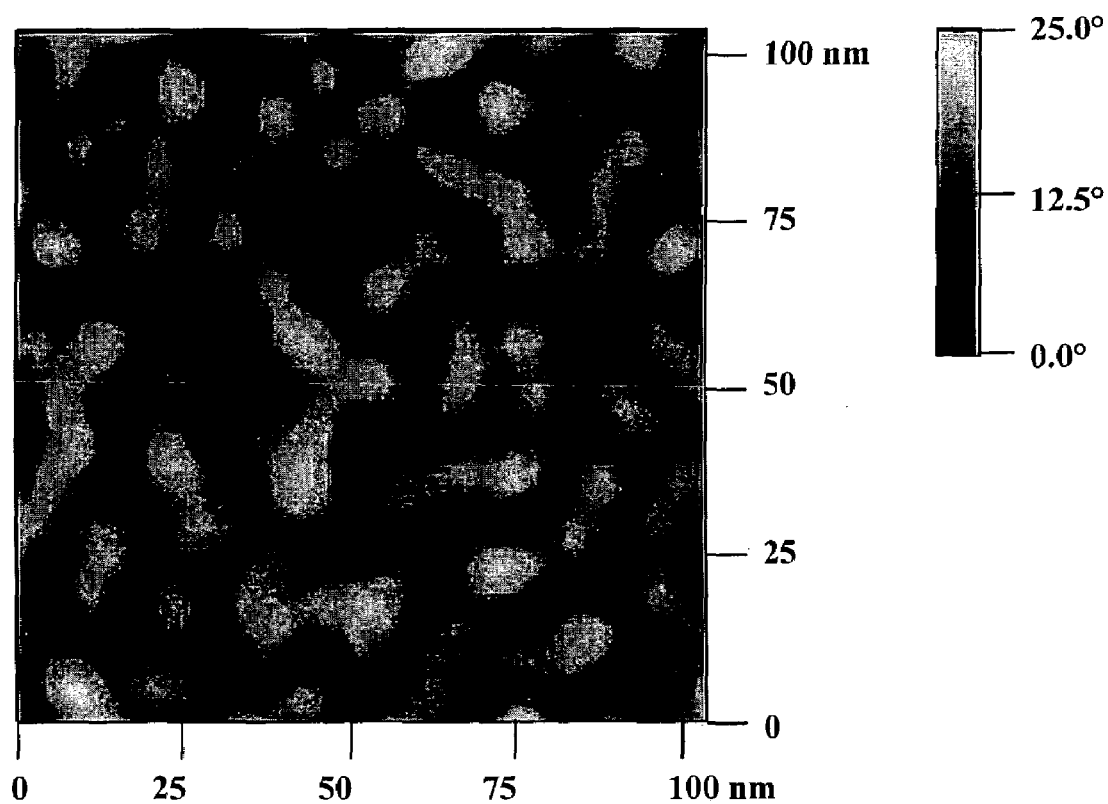
Figure 8A:
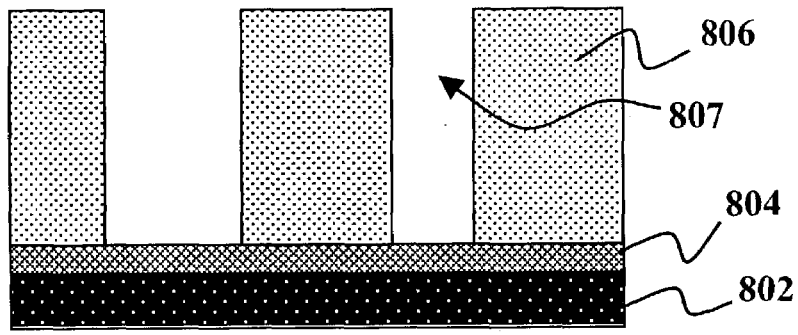
FIGS. 8A-8C show a series of cross-sectional diagrams illustrating electrodeposition of conducting material into the pores of a nano-architected porous film.
Figure 8B:
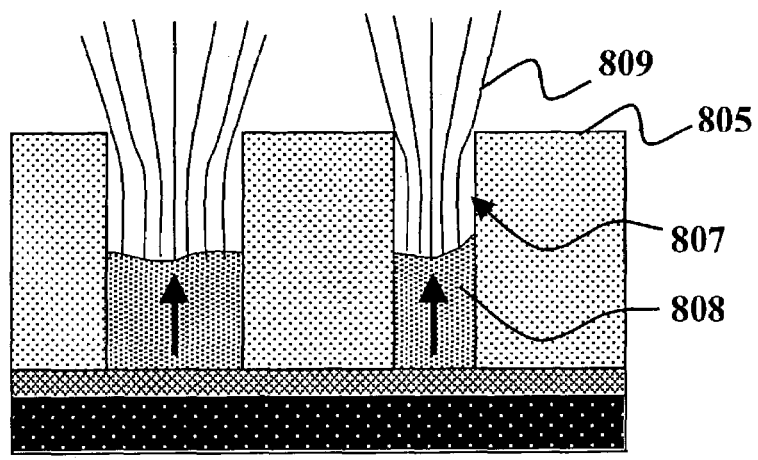

Alternatively, Atomic Force Microcopy (AFM) can be used to directly measure the sizes, orientations, and distributions of the pores in the nano-architected porous film 306, and to monitor the two-dimensional orientation of both inorganic and organic crystals, to characterize the surface roughness data of all films including the scratches and other defects. FIGS. 7A-7B depict atomic force micrographs of an example of a surfactant-templated porous film manufactured using techniques of the type described above. In this particular example, a porous film of $SiO_2$ was formed on a $F:SnO_2$ coated glass substrate using a sol mixture containing TEOS, Pluronic P123 as a surfactant, HCl as a condensation inhibitor, water and ethanol. The sol was filtered and a thin film was prepared from this solution by dip-coating onto a glass substrate. Prior to dip-coating, the substrate was cleaned and then dried by rinsing with isopropyl alcohol (IPA). FIGS. 8A-8B show phase contrast images, taken in tapping mode, of a nano-structured $SiO_2$ surface with features of about 10 nm diameter. The images have been modified to reduce noise and enhance contrast. Phase contrast is associated with changes in the viscoelastic properties. For example, small phase, indicated by the darker areas of the images, typically indicates the presence of a soft material. A relatively large change in phase, indicated by the lighter shaded areas in the images, may be associated with the presence of pores filled with air.

Although the forgoing embodiment utilizes a porous template film of $SiO_2$, alternative embodiments may use other metal alkoxides to produce mesoporous matrices made from materials other than $SiO_2$, e.g., $TiO_2$, $ZrO_2$, ZnO, etc. that are amenable to etching. Furthermore, blends of two or more alkoxides with different central elements, e.g., Si, Ti, Zr, Zn, etc., may be used in precursor sols to produce porous template films made from blends of two or more different oxide materials such as $SiO_2$, $TiO_2$, $ZrO_2$, ZnO, etc.

C. Filling Pores in the Nano-Architected Porous Film

As described above with respect to step 206, after construction of the nano-architected porous film 306, the pores 307 within the porous film 306 are substantially filled with a conducting material 308 such as copper, aluminum, silver, gold, etc. Alternatively, semiconductor materials such as CdSe, CdS, Titania ($TiO_2$) Zirconia ($ZrO_2$), ZnO, CuO and/or CdTe materials can be deposited into the pores 307 in the nano-architected porous film 306, e.g., using standard electrodeposition or chemical bath deposition techniques. In a particular embodiment, the pores 307 can be filled by electrochemically growing metal or semiconductor within the pore channels of the nano-architected porous film 306.

As used herein, the term "substantially filled" generally means that the pore-filling material 308 fills a significant volume of a sufficient percentage of the pores 307. It is often desirable to completely fill at least some of the pores 307 with the pore-filling material 308. In general, the larger the percentage of completely filled pores the better the performance of the resulting nanostructured transparent conducting electrode. In particular, porous thin films with pores ranging from 4-10 nm in diameter may be filled with an electron accepting, conducting material 308 by electrodeposition. By maximizing the number of pores that are filled, the electrical conductivity of the nanostructured transparent conducting electrode 310 may also be maximized.

Where the pores 307 are filled by electrodeposition, a surface of the transparent conducting layer 304 may serve as a working electrode. Electrodeposition drives the growth of a metal or semiconductor material within the pores 307 from the transparent conducting layer 304 towards the exposed surface 305 of the nano-architected porous film 306. The transparent conducting layer 304 serves as a conducting electrode to attract metal ions from solution and thus drive the formation of material within the pores 307. In general, the resistivity of the conducting layer 304 may be between about 10,000 Ωcm and about 1 Ωcm, more preferably, between about 92 Ohm cm and about 100 Ωcm, most preferably between about 1000 Ωcm and about 250 Ωcm.

The inventors have determined that low-cost, high-resistivity transparent conducting films are actually beneficial in that the high resistivity serves to better control the electrodeposition process. The applicants have also determined that the finished transparent conducting electrodes described herein are relatively insensitive to the quality of the transparent conducting layer 304 may be relatively poor in terms of roughness and defects. Thus, relatively inexpensive transparent conducting films with high resistivity can be used to build low resistivity nanostructured transparent conducting electrodes.

In an electrodeposition technique, the nano-architected porous film 306 itself may be used to modulate the electric field lines such that they create a selective deposition of metal or other material within the pores 307. As a general example, techniques for electroplating metals are well known in the literature. An electrical potential difference is applied between an electrode immersed in the plating solution and the substrate, also immersed in the plating solution. Advantageously, a pulsed plating technique can be used wherein the potential difference is varied in a periodic fashion to tailor the crystallite sizes of the nanostructured materials as they are grown, in order to enhance crystallinity, enhance adhesion of the nanostructures, decrease interface traps, and decrease material stresses.

By way of example, and without limitation, metals such as aluminum, copper, silver, gold, etc. and their alloys and oxides may be electrodeposited from a metal lactate solution on a conducting substrate at room temperature. The metal lactate solution may be prepared by addition of metal sulfate (1 eq, 2.25 g) to a solution containing lactic acid (2.4 eq., 1.95 g) and 3 mls water. Slowly, 5M sodium hydroxide (6 mls) may then be added to the solution and the reaction may be allowed to stir for 2-12 h. After this time the pH of the solution may be adjusted to 9.0. Electrodeposition occurs at the working electrode by maintaining a constant voltage of 1.0 V relative to a Pt reference electrode. Voltage or metal concentration can be adjusted to alter the electrodeposition rate.

Pores in $SiO_2$-based nano-architected porous films may be nearly uniformly filled (>90%) with silver under constant current conditions using pulsed electrodeposition. For a high rate of deposition it is desirable for the plating solution to have a high concentration of electroactive silver species. In the case of pulsed electrodeposition through an insulating barrier layer a high negative polarization is desirable. Consequently, the plating solution cannot contain other electroactive species, e.g., nitrate ions that could otherwise participate in side reactions. Furthermore, a high conductivity in the plating solution is desirable for uniform deposition into pores. For deposition of silver, a plating solution may include silver sulfate (e.g., at 8.5 g/l) as a source of silver ions. The plating solution may include diammonium hydrogen citrate (e.g., at 200 g/l) to ensure a high conductivity and to adjust the pH to 4.5. The plating solution may also contain potassium thiocyanate at 105 g/l, which serves to dissolve precipitated silver salt. Pulsed electrodeposition may be implemented in the form of modulated double pulses (e.g., 6 ms, +6 V, 15 mA/cm$^2$, followed by 6 ms, −6 V, 15 mA/cm$^2$). During each pulse of negative current, silver is deposited at the bottom of the pores. A relatively high current density may be applied to increase the number of nucleation sites in each pore. After each negative deposition pulse, a positive polarization pulse is applied to discharge the capacitance of the barrier layer and to interrupt the electric field at the deposition interface. A delay of up to 1 second may occur between the pulses to ensure restoration of the silver concentration at the pore bottom.

As set forth above, electrodeposition of metals, conducting or semiconducting polymers, semiconductors or other materials may be used to fill the pores of the nano-architected porous film with the conducting material 308. Electrochemical, solution-based deposition methods provide a more attractive alternative approach, particularly for depositing metal structures, because of the high degree of control that can be achieved by varying the electrode potential. In electrodeposition, control of current allows control of the rate of deposition and, consequently, control of the morphology of the resulting film. Electrodeposition also avoids the need for high temperatures, high pressures, or vacuum, which can greatly reduce the cost of the resulting structures.

Figure 8C:
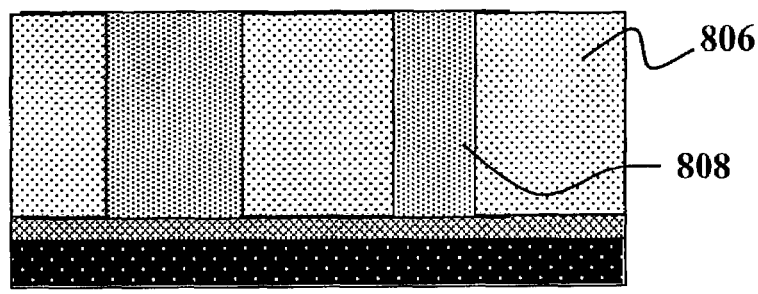

FIGS. 8A-8C depict a sequence of cross-sectional diagrams illustrating electrodeposition of material into the pores of a mesoporous template. FIG. 8A shows a cross-section of a partially completed transparent conducing electrode having a nano-architected porous film 806 with a network of interconnected pores 807, formed on a layer of transparent conducting material 804, which is disposed on a substrate 802. The nano-architected porous film 806 may be made from a glass (e.g., $SiO_2$) or polymeric material. The pores 807 may be substantially uniformly distributed and regularly arrayed with a separation distance between adjacent nanostructures in the array on the order of about 1 to about 100 nm, preferably about 1 nm to about 25 nm and most preferably about 5 nm to about 15 nm.

As shown in FIG. 8B, conducting material 808, such as a metal is electrodeposited into the nanopores 807 in the nano-architected porous film 806. The localized electrodeposition rate is proportional to the localized current density. In FIG. 8B, lines of current 809 represent the localized current density. The more closely the lines of current 809 are spaced, the greater the localized current density. Where the nano-architected porous film 806 includes with deep pores 807 in a polymeric or glass mold, the current density tends to be non-uniform proximate the pores 807, resulting in selective deposition in the pores 807. The selective deposition fills the nanopores 807 with the material 808 resulting an array of filled pores as shown in FIG. 8C.

Figure 9A:
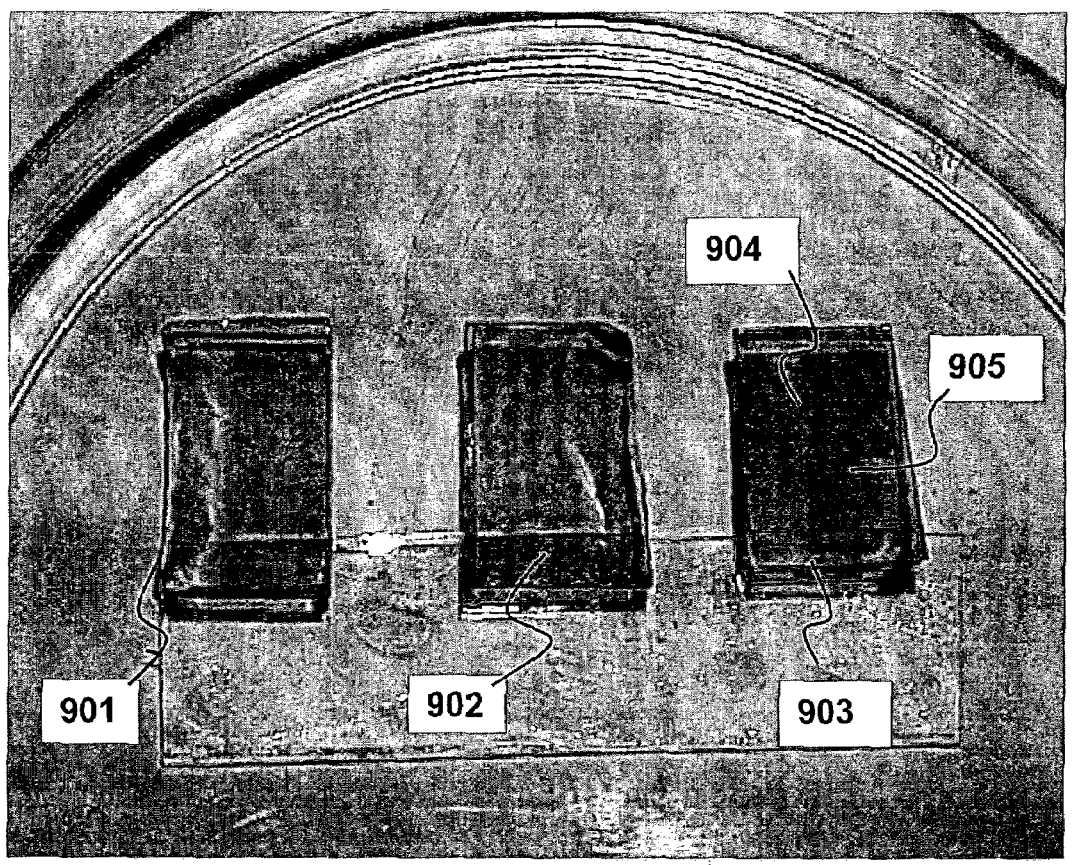
FIG. 9A shows three substrates used in an experiment to demonstrate deposition of material into pores in a nano-architected porous film.
Figure 9B:
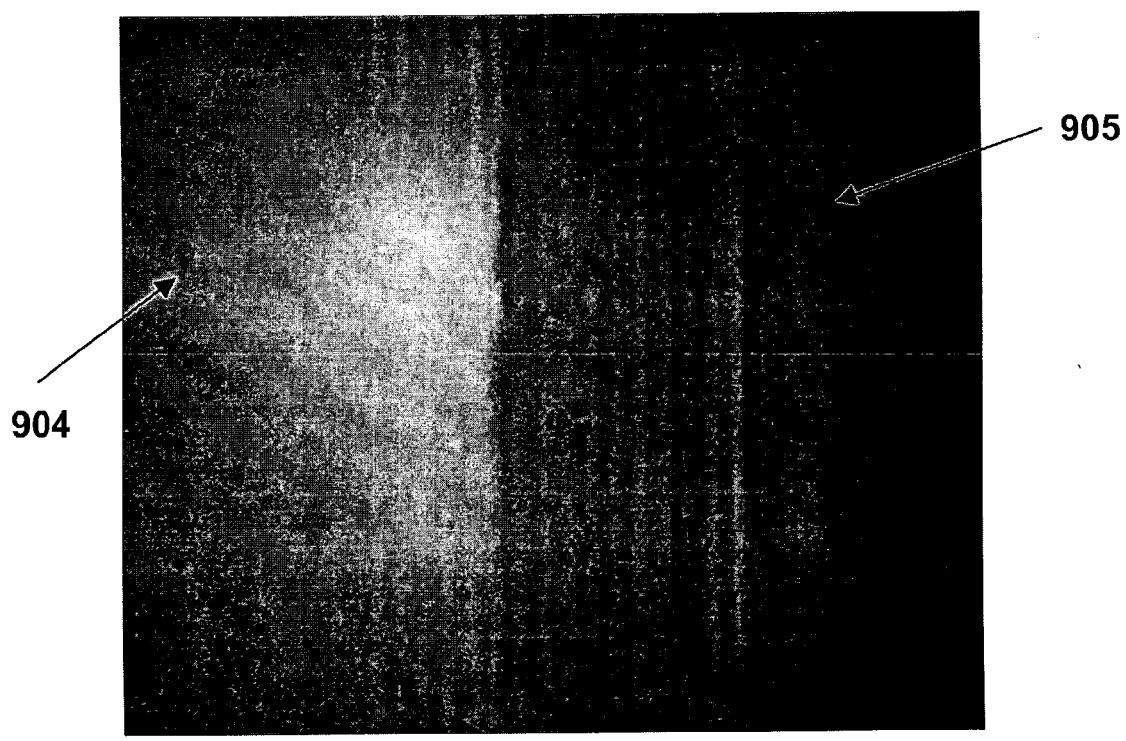
FIG. 9B is a magnified image of a portion of one of the substrates shown in FIG. 9A.

The inventors have conducted an experiment to demonstrate the filling the pores in a nano-architected porous film by electrodeposition. FIG. 9A depicts three substrates that were used in the experiment. A first substrate 901 is uncoated fluorinated tin oxide (F:$SnO_2$). A second F:$SnO_2$ substrate 902, which served as a control, was coated with non-porous TEOS lacking a surfactant. A third F:$SnO_2$ substrate 903 was coated with a mesoporous template using TEOS and hexadecyl trimethylammonium bromide (CTAB) as a surfactant. Unmasked portions of the second substrate 902 and third substrate 903 were placed in an electrochemical bath and electric currents were applied. No metal deposition occurred on the second substrate 902. Metal deposition occurred in the pores of the mesoporous template on the third substrate 903 as indicated by the dark region 904 at the top of the third substrate 903 compared to a porous region 905 that was masked prior to deposition. The contrast between the unmasked porous region 904 and the masked porous region 905 is also clear from the magnified shown in FIG. 4B, which shows uniform deposition (color) across the surface.

V. OPTOELECTRONIC DEVICES USING NANOSTRUCTURED TRANSPARENT CONDUCTING ELECTRODES

A. Examples of Devices

Nanostructured transparent conducting electrodes of the types described above may be incorporated into a number of optoelectronic devices. In examples of particular embodiments, the nanostructured transparent conducting electrodes described herein can be integrated into passive devices such as antistatic films, antireflective stacks, electromagnetic shielding, heat-efficient electrochemical windows, electrochromic windows and electroluminescent lamps. Furthermore, such nanostructured TCE's can be integrated into active devices such as flat panel displays (FPD), light emitting diodes, laser diodes, transparent membrane switches, touch screens, and thin film solar cells. In each of these devices, energy savings can be generated during device operation through the lower resistivity of the nanostructured transparent conductive electrode.

According to an embodiment of the present invention, an optoelectronic device includes (1) an active layer and (2) one or more nanostructured transparent electrodes of the type described above in electrical contact with the active layer. The active layer may be configured to mediate an interaction between radiation and electrical charge. Such an interaction may generate an electric voltage and/or current from radiation as in a photovoltaic device, such as a solar cell. Alternatively, the interaction may convert electrical energy into emitted radiation as in an LED, laser, or other radiation-emitting device.

Figure 10:
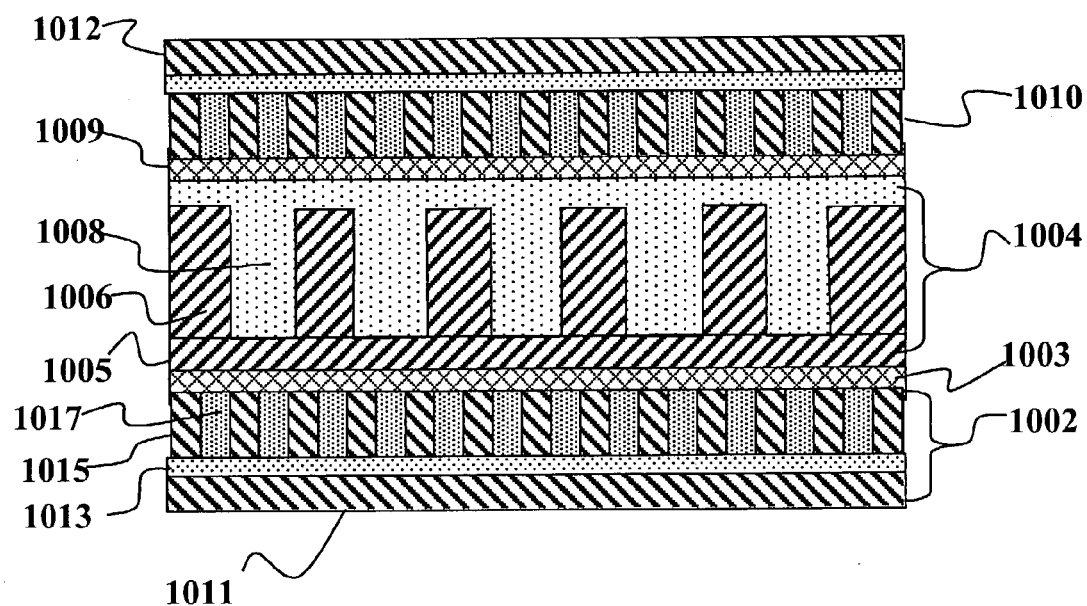
FIG. 10 depicts an optoelectronic device that incorporates a nanostructured TCE according to an embodiment of the present invention.

FIG. 10A depicts an example of a device structure for an optoelectronic device 1000 according to an embodiment of the present invention. The optoelectronic device 1000 generally includes an active layer 1004 disposed between a nanostructured transparent conducting electrode 1002 of the type described above and a second electrode 1010. The device 1000 may optionally be protected by encapsulants 1012, 1014. Furthermore, a first optional interface layer 1003 may be disposed between the active layer 1004 and the nanostructured transparent conducting electrode 1002. The interface layer 1003 may improve charge transfer between active layer and the nanostructured transparent conducting electrode 1002. The interface layer 1003 may also improve mechanical properties such as flexibility and resistance to short circuits. A similar second optional interface layer 1009 may be disposed between the active layer 1004 and the second electrode 1010. The optional interface layers 1003, 1009 may be made from conducting polymers, such as PEDOT or polyaniline. Alternatively, the interface layers 1003, 1009 may include a material, such as lithium fluoride (LiF) that improves charge injection into the electrodes 1002, 1010 or smoothes out the surface roughness of the electrodes 1002, 1010.

The optional encapsulants 1012, 1014 protect the device 1000 from the surrounding environment. Examples of suitable encapsulant materials include one or more layers of polymers, such as polyethylene terephthalate (PET) and/or Mylar®. Mylar is a registered trademark of E.I. du Pont de Nemours and Company of Wilmington, Del. Inorganic materials, such as glass and metal foils may also be used for the encapsulants 1012, 1014. Ethylene vinyl acetate (EVA) may be used in either case in conjunction with the other encapsulant. The encapsulants 1012, 1014 may also include nitrides, oxides, oxynitrides or other inorganic materials that protect against exposure to water or air. The encapsulants 1012, 1014 may also absorb UV-light to protect organic materials disposed between the encapsulants 1012, 1014.

The nanostructured transparent conducting electrode 1002 can have features in common with the those described above with respect to FIGS. 1B, 1C and 3A-3D. In particular, the nanostructured transparent conducting electrode 1002 generally includes an optional substrate 1011, a transparent conducting layer 1013, a nano-architected porous film 1015 with a network of interconnected pores and a conducting material 1017 that fills pores in the nano-architected porous film 1017.

The second electrode 1010 may also be a nanostructured transparent conducting electrode, though it need not necessarily be either transparent or nanostructured. Whether the second electrode is transparent depends partly on the nature of the device 1000. For example, if the device 1000 is a window (e.g., an electrochemical or electrochromic window) both electrodes 1002, 1010 need to be transparent. On the other hand for radiation emitting devices such as LED's or laser diodes or radiation absorbing devices such as solar cells the second electrode 1010 need not be transparent. In such a case, the second electrode 1010, which may serve as a base for the device 1000, may be in the form of a commercially available sheet material such as such as C-, Au-, Ag-, Al-, or Cu-coated Steel Foil.

In general, the active 1004 layer may include a single layer of material or multiple layers. The active layer 1004 may generate, absorb, or transmit radiation that passes through the nanostructured transparent electrode 1002. For example, in an electrochromic window, the active layer may comprise a polymer electrolyte disposed between a layer of vanadium pentoxide and a layer of tungsten oxide. The passage of a small current between the electrodes 1002, 1010 changes the tungsten oxide from transparent to substantially opaque. In another example the active layer 1004 may include a liquid crystal layer disposed between to alignment layers. Such structures may be used, e.g. in liquid crystal displays.

In the particular example shown in FIG. 10A, the active layer 1004 may be in the form of an exciton-splitting and charge transporting network. Such a network typically includes two complementary semiconductor materials, e.g., an electron accepting material and a hole accepting material. In general, the two materials will have different electron affinities. Interaction between radiation and charge occurs in the vicinity of an interface between the two different materials in the active layer. To increase the effective area of the interface, the two complementary semiconductor materials may be in the form of a nanoscale grid network 1006 and a network-filling material 1008. The nanoscale grid network 1006 and network filling material 1008 are shown in simplified form for the sake of clarity. Although the structures in the grid network 1006 may be aligned substantially parallel to each other as shown in FIG. 10A, the structures may also be interconnected and, most importantly, accessible from both neighboring layers, e.g. electrodes 1002, 1010 or interface layers 1003, 1009. One possible variation, among others, of a possible configuration of the structures in a nanaoscale grid network is that shown in FIG. 4.

The nanoscale grid network 1006 contains substantially uniformly distributed, e.g., regularly spaced, structures roughly 1 nm to 100 nm in diameter and more preferably, about 5 nm to about 15 nm in diameter. In general, neighboring structures are between about 1 nm and about 100 nm apart measured, e.g., from nearest edge to nearest edge. More preferably, the pores are between about 5 nm apart and 15 nm apart, edge to edge. In many optoelectronic devices, e.g.

photovoltaic devices, it is desirable for the size and spacing of the structures to be on the order of the exciton diffusion length in the material of the grid network 1006 and network filling material 1008. A substantially uniform distribution of the structures can enhance the overall conversion efficiency of the device 1000.

The network-filling material 1008 fills the spaces between the structures in the nanoscale grid network 1006. The network-filling material 1008 has complementary charge-accepting properties with respect to the nanoscale grid network 1006. An optional charge-transport film 1005 inhibits or prevents direct contact between nanoscale grid network 1006 and the nanostructured transparent electrode 1002. The nanoscale grid network 1006 may cover the network-filling material 1008 in such a way as to inhibit direct contact between the network-filling material 1008 and the second electrode 1010.

By way of example, and without loss of generality, the nanoscale grid network 1006 may be made from an electron-accepting material, e.g., Titania, ($TiO_2$) zinc oxide ($ZnO_2$), zirconium oxide, lanthanum oxide, niobium oxide, tungsten oxide, strontium oxide, calcium/titanium oxide, sodium titanate, potassium niobate, Cadmium Selenide (CdSe), Cadmium Sulfide (CdS), or Cadmium Telluride (CdTe) as well as blends of two or more such materials such as $TiO_2/SiO_2$ blends/ hybrids. In such a case, the network filling material may be made from a hole accepting material. The network-filling material 1008 may be a semiconducting, e.g., hole-accepting, organic material. Examples of suitable semiconducting organic materials include conjugated polymers such as poly (phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly (para-phenylene vinylene), (PPV)), poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable semiconducting polymers include organometallic polymers, polymers containing perylene units, poly(squaraines) and their derivatives. Other suitable semiconducting pore-filling materials include organic pigments or dyes, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f]diisoquinoline-1,3,8,10-tetrone, and 2,9-Bis-(1-hexyl-hept-1-yl)-anthra[2,1,9-def:6, 5, 10-d'e'f]diisoquinoline-1,3,8,10-tetrone.

Alternatively, the network-filling material 1008 may be a hole-accepting inorganic material, such as copper oxide or an electron-accepting inorganic material in the case of a complementary structure. Furthermore, the network-filling material 1008 may be a combination of two or more compounds, e.g., solubilized buckininsterfullerene ($C_{60}$) and/or a dye, such as perylene and/or a polythiophene derivative. The combination of the electron-accepting nanoscale grid network 1006 and the hole-accepting network-filling material 1008 creates a nanoscale, high-interfacial area exciton-splitting and charge transporting network.

There are many possible variations on the basic structure described in the example above. For example, the nanoscale grid network 1006 may be made from metal oxides, other than $TiO_2$, or blends of metal oxides, or blends of $TiO_2$ and $SiO_2$ precursor materials or other semiconducting compounds that are capable of accepting electrons from the network-filling material 1008 and transporting the electrons. Furthermore, the nanoscale grid network 1006 may be made from metal oxides or other semiconductor compounds (e.g., conjugated polymers or dyes) that are hole-acceptors with respect to the network-filling material 1008. One example, among others, of such a semiconductor material is copper oxide (CuO). In such a case, the network-filling material 1008 would be an electron accepting material with respect to the material of the nanoscale grid network 1006. Furthermore, in the case of a complementary structure, i.e., where the nanoscale grid network 1006 is made from a hole-accepting material, the network-filling material 1008 may be an electron-accepting organic material.

B. Fabrication of Devices

Devices of the types described above may be fabricated by numerous different methods. All of these methods at some point involve the fabrication or incorporation of one or more nanostructured transparent conducting electrodes of the type described above. Two basic approaches to integrating nanostructured transparent conductive electrodes into optoelectronic device fabrication are described below.

Figure 11A:
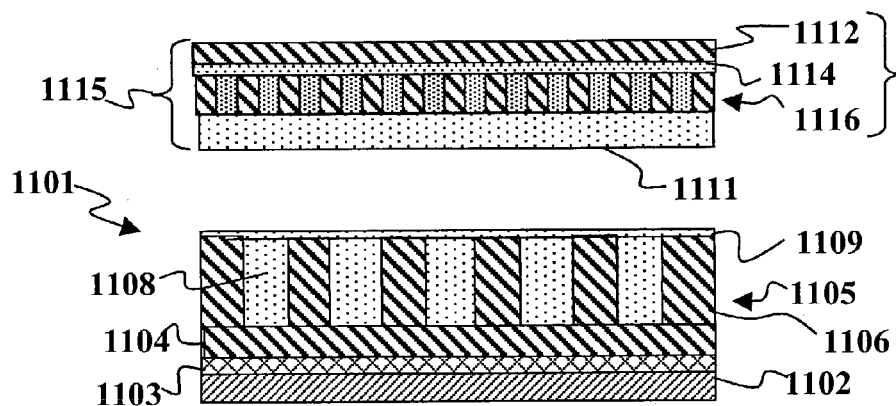
FIGS. 11A-11C depict a series of cross-sectional schematic diagrams illustrating a scheme for fabricating an optoelectronic device according to an embodiment of the present invention.
Figure 11B:
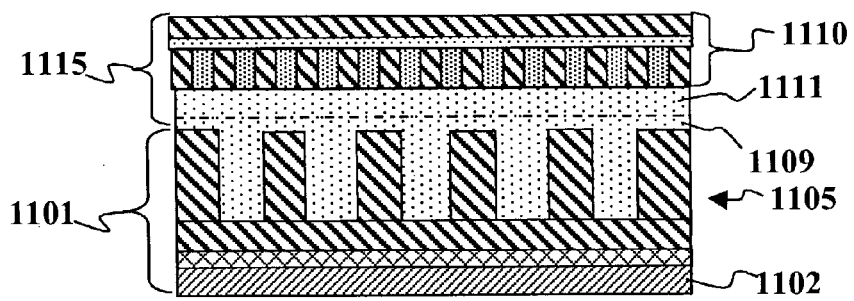
Figure 11C:
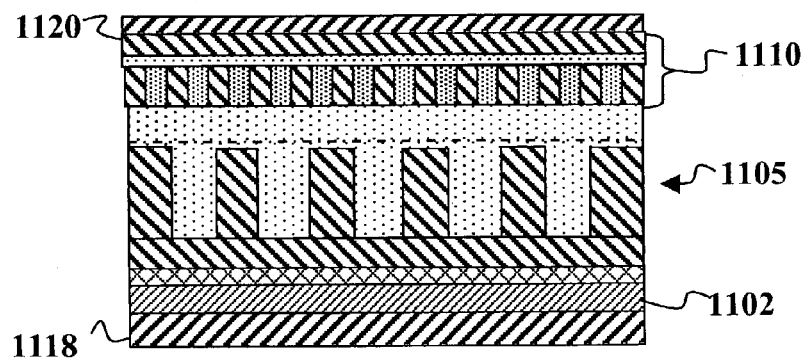

In the first approach, a nanostructured TCE may be fabricated as a sub-assembly and then coated with a polymer and subsequently laminated to the "other half" of the device. Commonly assigned co-pending U.S. patent application Ser. Nos. 10/290,119 and 10/303,665 describe this approach. A particular example of the fabrication of a photovoltaic device that follows this approach is shown in FIGS. 11A-11C. A first sub-assembly 1101 of a solar cell device may be built up from a conventional first electrode 1102, e.g., in the form of a commercially available sheet material such as such as C-, Au-, Ag-, Al-, or Cu-coated Steel Foil. A nanostructured active layer 1105 having a nanoscale grid network 1106 and network filling material 1108 may then be formed on the first electrode 1102 as shown in the lower portion of FIG. 11A. A first interface layer 1103 may optionally be formed between the first electrode 1102 and the nanostructured layer 1105. An optional first charge-transport film 1104 may be formed on either between the first electrode 1102 and the first interface layer 1103 or between the first electrode 1102 and the nanostructured layer 1105.

There are two basic approaches to fabricating the nanostructured active layer 1105. In the first approach, the network filling material 1108 may be formed first, e.g., using a nanoarchitected porous film made of titania (an electron acceptor). The pores in the titania film may then be filled with a hole-acceptor, e.g. a conjugated polymer or CuO to form the nanoscale grid network 1106. Examples of this approach are described in U.S. patent application Ser. No. 10/290,119. In the second approach, a silica based nano-architected porous template film is formed first. The pores in the template film are then filed with semiconducting or conducting material, e.g., by electrodeposition. The silica template is then removed, e.g., by etching, leaving behind the nanoscale grid network 1106. A complementary semiconducting or conducting material, e.g., a conjugated polymer then fills the spaces in the network grid that were formerly occupied by the silica template. Examples of this approach are described in U.S. patent application Ser. No. 10/303,665. A first charge-transport film 1109, may optionally be applied to the exposed surface of the active layer 1105 to complete the first sub-assembly 1101 shown in the lower portion of FIG. 11A.

Figure 12A:
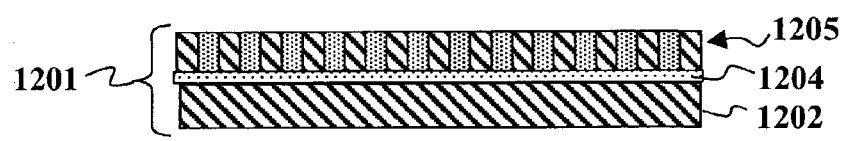
FIGS. 12A-12C depict a series of cross-sectional schematic diagrams illustrating an alternative scheme for fabricating an optoelectronic device according to an embodiment of the present invention.
Figure 12B:
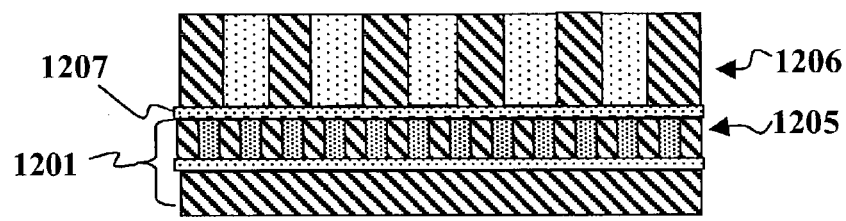
Figure 12C:
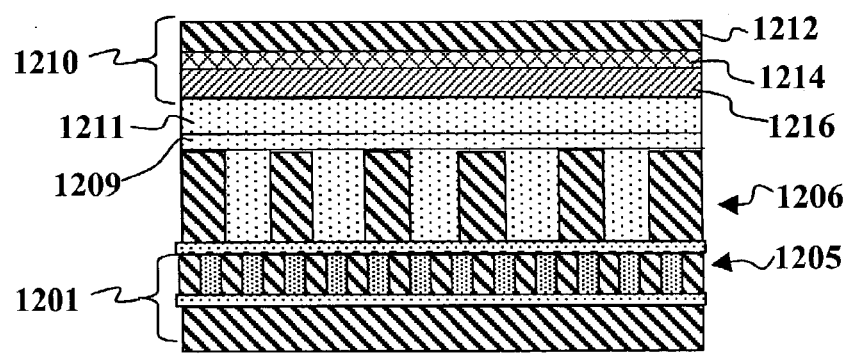

A nanostructured TCE 1110 having a nanostructured layer 1116 may be separately fabricated, e.g., from a glass substrate 1112 and layer of transparent conducting material 1114 as described above with respect to FIGS. 2 and 3A-3D. An optional second charge transport film 1111 may be applied to the exposed surface of the nanostructured layer to form a second sub assembly 1115 shown in the upper portion of FIG. 11A. The first and second sub assemblies 1101, 1115 may be laminated together as shown in FIG. 11B with the first and second charge transport-films 1109, 1111 facing each other. Subsequently, the laminated device may optionally be protected with encapsulant layers 1118, 1120. Alternatively a device, e.g., of the type depicted in FIG. 10, may be built up layer by layer starting from a nanostructured transparent conducting electrode as a substrate. Such an approach may proceed e.g., as shown in FIGS. 12A-12C. Starting as shown in FIG. 12A, a first sub-assembly of the device may be built up from a nanostructured TCE 1201. The nanostructured TCE has a nanostructured layer 1205 and may be fabricated, e.g., from a glass substrate 1202 and layer of transparent conducing material 1204 as described above with respect to FIGS. 2 and 3A-3D. As shown in FIG. 12B an active layer 1206 may be build on top of the nanostructured TCE. For example, a second layer of transparent conducting material 1207 may be formed on the exposed surface of the nanostructured layer 1205. The active layer 1206 may then be fabricated as described above with respect to FIG. 11A. As a particular example, a titania mesoporous grid may be onto the second layer of transparent conducting material 1207. The titania grid may be filled e.g. with copper oxide. As shown in FIG. 12C, a second sub-assembly including a second electrode 1210 may be built as a separate sub-assembly and laminated to the first sub-assembly. In the example shown in FIG. 12C, the second electrode 1210 is a conventional electrode built up from a layer of sheet material 1212, a conducting layer 1216 (which may be transparent) and an optional interface layer 1214 disposed between the sheet material 1212 and conducting layer 1216. Alternatively, second electrode 1210 may be a nanostructured TCE, which may be laminated to the first sub-assembly e.g., as described above with respect to FIG. 11B. Optional charge transport films 1209, 1211 may be applied respectively to the active layer 1206 and the conducting layer 1216 prior to lamination. The resulting device may optionally be encapsulated as described with respect to FIG. 11C.

Figure 13A:
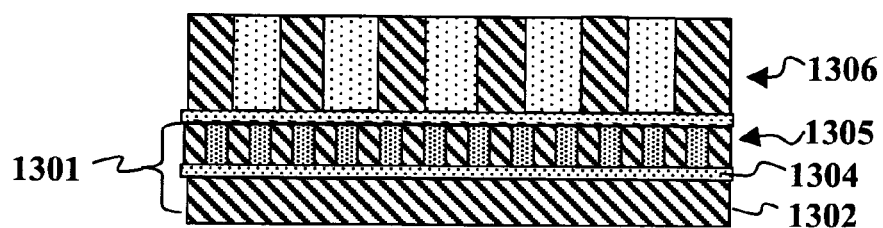
FIGS. 13A-13C depict a series of cross-sectional schematic diagrams illustrating an another alternative scheme for fabricating an optoelectronic device according to an embodiment of the present invention.
Figure 13B:
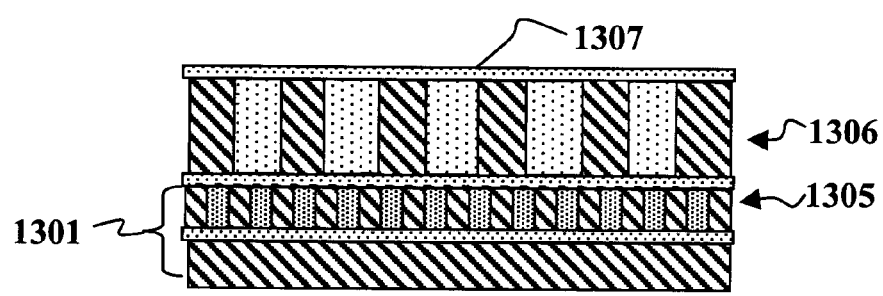
Figure 13C:
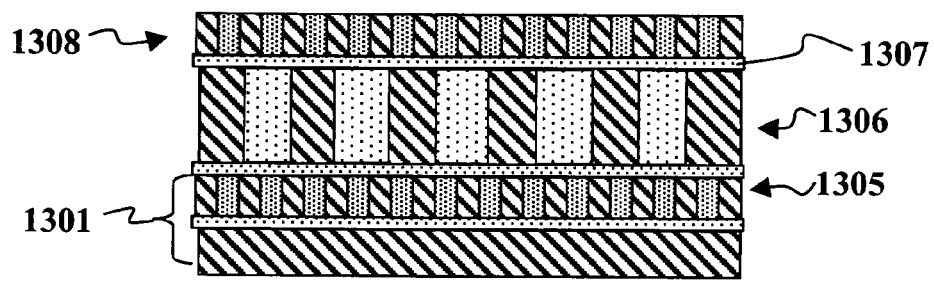

In another alternative device fabrication scheme a nanostructured TCE may be build up from the active layer of a device. An example of such a scheme is depicted, e.g., in FIGS. 13A-13C. As shown in FIG. 13A an active layer 1306 is built on a first electrode 1301. In the example depicted, fabrication may proceed as described above with respect to FIG. 12A. Specifically, the first electrode 1301 may be nanostructured TCE with a substrate 1302, transparent conducting layer 1304 and nanostructured layer 1305 fabricated as described with respect to FIGS. 2 and 3A-3D. Alternatively, the electrode 1301 may be a conventional electrode as described with respect to FIG. 11A (lower portion). The active layer 1306 may be nanostructured and fabricated as described above with respect to FIG. 11A. An interfacial layer of transparent conducing material 1307 (e.g., a transparent conducting oxide such as ITO or the like) may be formed on the active layer 1306 as shown in FIG. 13B. A second nanostructured TCE 1308 may then be built upon the interfacial layer of transparent conducing material 1307 as described with respect to FIGS. 2 and 3A-3D. Once the second nanostructured TCE 1308 is complete, the entire device may optionally be encapsulated as described with respect to FIG. 11C.

VI. ALTERNATIVE EMBODIMENTS

A. Solar Power Generation Systems

Figure 14A:
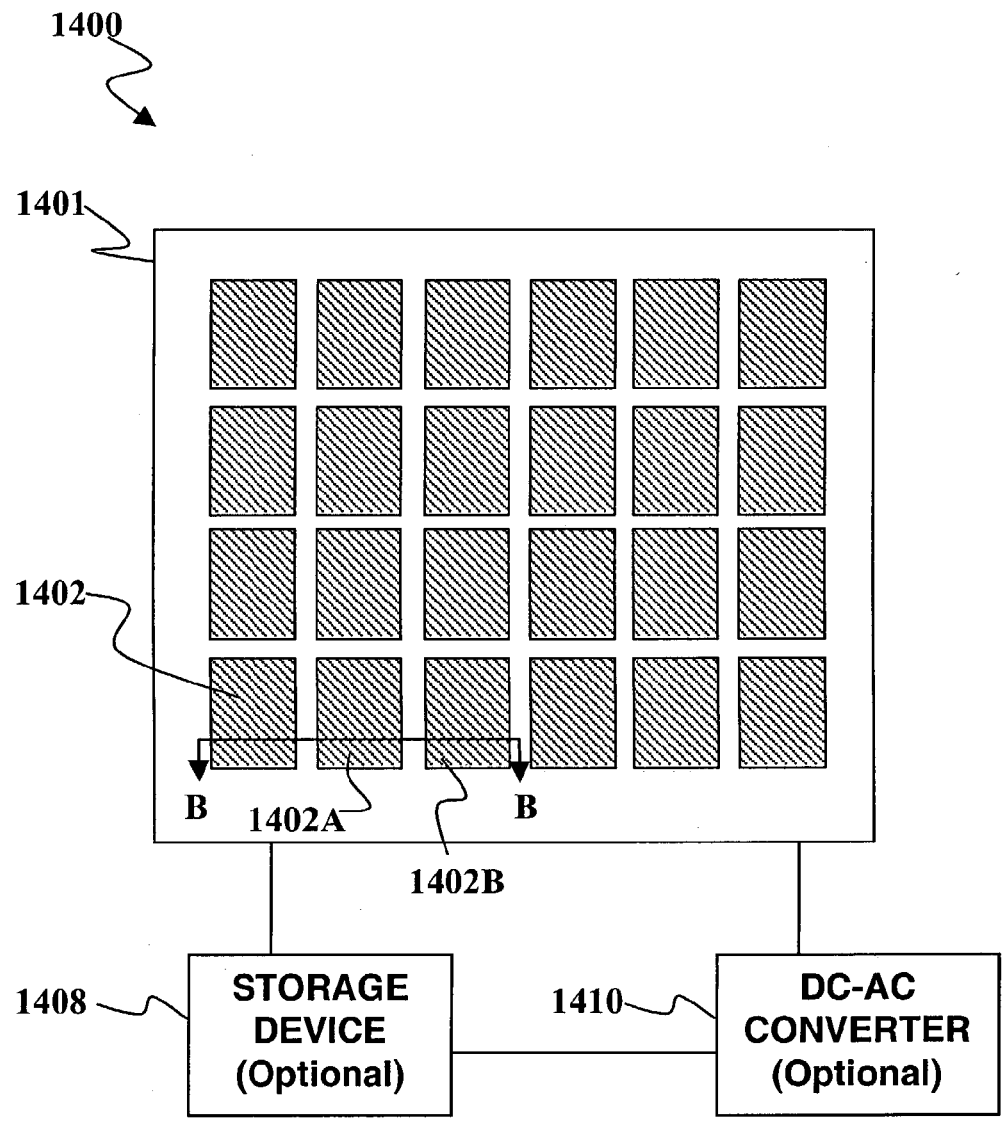
FIGS. 14A-14B depict a solar power generation system according to an embodiment of the present invention.
Figure 14B:
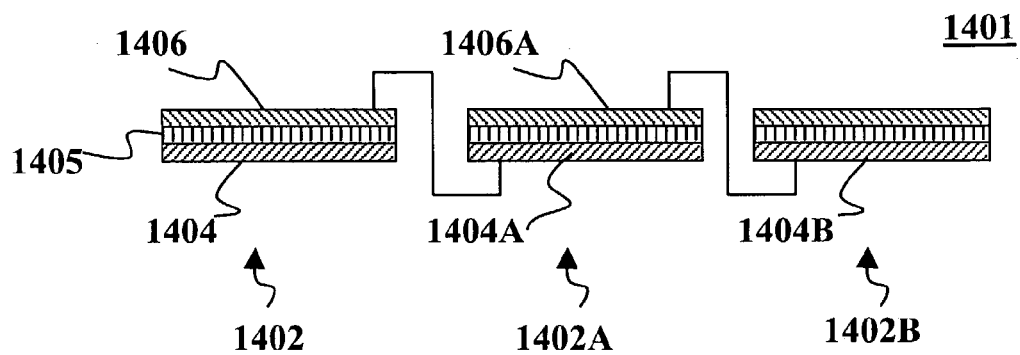

Other embodiments of the present invention may be directed to solar power generation systems that utilize photovoltaic cells that incorporate nanostructured transparent conducting electrodes of the types described above. An example of such a power generation system 1400 is depicted in FIGS. 14A-14B. The power system 1400 generally comprises an array 1401 of photovoltaic cells 1402. Each of the cells 1402 in the array 1401 may include an active layer 1405 disposed between a first electrode 1404 and a second electrode 1406. At least one of the electrodes 1404, 1406 in one or more cells 1402 is a nanostructured transparent conducting electrode having a layer of transparent conducting material, a nano-architected porous film with interconnected pores disposed on the layer of transparent conducting material an electrically conductive material that substantially fills the pores.

The active layer 1405 in one or more cells 1402 in the array 1401 may include a nanoscale network grid having uniformly distributed nanometer-scale structures, with spaces between the structures filled with a network-filling material. One or more cells 1402 in the array 1401 may include an active layer of the type described above with respect to FIG. 10. Specifically, the active layer 1405 may include an exciton-splitting and charge transporting network having a nanoscale grid network and a network-filling material that substantially fills the spaces between the structures in the nanoscale grid network. The nanoscale grid network and network-filling material may have complementary charge-transfer properties with respect to each other as described above. Examples of such charge splitting networks are described in commonly assigned U.S. patent application Ser. Nos. 10/290,119, 10/303,665, and 10/319,406, all of which have been incorporated herein by reference. The network grid and the network-filling material have complementary semiconducting properties with respect to each other, i.e., one material acts an electron-acceptor with respect to the other material, which acts as a hole-acceptor. The electron-acceptor would be in electrical contact with the first electrode 1404 and the hole-acceptor material would be in electrical contact with the second electrode 1406. An interaction between radiation and the exciton-splitting and charge transporting network 1405 generates an electrical voltage between the first electrode 1404 and the second electrode 1406.

To obtain higher aggregate voltages, two or more cells, e.g., cells 1402, or groups of cells, may be electrically connected in series. For example, as shown in FIG. 14B, cells 1402, 1402A, and 1402B are connected in series, with the second electrode 1406 of cell 1402 connected to the first electrode 1404A of cell 1402A and the second electrode 1406A of cell 1402A connected to the first electrode 1404B of cell 1402B. There are many commercial solutions to interconnect of solar cells, many of which can be applied to the device structure. For example, standard scribing/etching techniques as used by many thin-film manufacturers can be used. For instance, either the first electrode or the second electrode may be separated by laser grooving, mechanical separation (mechanical grooving), or a separating line (e.g., ~0.5 mm wide) can be etched across a large area photovoltaic web using a macroscopic screen (no photolithography is required). Once the cells 1402 are divided from one another, they can be interconnected in series by overlapping the transparent electrodes (which can be similarly divided) with the bottom layer.

Organic solar cells often generate higher voltages than most inorganic cell structures, resulting in individual cell voltages between 0.7 and 1.3 V, and thus these cells require fewer interconnects to obtain the higher aggregate voltages as desired in many applications. Conventional cells tend to generate only about 0.5 to 0.8V per cell; and, further, silicon-based cells are restricted to the common silicon wafer sizes so that they need to connect many cells in parallel to obtain high currents by covering a larger surface area.

The system may optionally include an energy storage device 1408 connected to the array 1401. By way of example, the energy storage system may be in the form of one or more batteries or one or more electrolytic cells for producing hydrogen from water using electricity generated by the cells 1402 in the array 1401. Alternatively, the cells 1402 may be configured to generate hydrogen from water directly using a radiation-driven electrolytic reaction. The storage device 1408 may include a storage tank for holding the hydrogen and/or a fuel cell for converting the energy stored in the hydrogen back to electric power on demand.

The system 1400 may be scaled as a stand-alone for a commercial or residential facility. Alternatively, the system may include an optional DC-AC converter 1410 so that electric power produced by the system 1400 may be distributed over a conventional electric power grid. Because of the improved efficiency and lower manufacturing cost of photovoltaic cells of the type described herein the system 1400 is potentially capable of producing electric power at a cost per kilowatt hour (kwh) competitive with conventional electric grid rates.

B. Alternative Approaches to Porous Nano-Architected Films

Although portions of the above description describes formation of porous nano-architected films by a particular templated growth technique that uses surfactants as a structuring agent, the present invention is not limited to this technique alone. Porous nano-architected films for nanostructured transparent conducting electrodes and/or exciton-splitting and charge transporting networks for optoelectronic devices may alternatively be fabricated by such approaches as: (a) Intercalation and/or grafting of organic or polymeric molecules within a mineral lamellar network; (b) Synthesis by electrocrystallisation of hybrid molecular assemblies; (c) Impregnation of preformed inorganic gels; (d) Synthesis from heterofunctional metallic alkoxides or silsesquioxannes; (e) Synthesis of hybrid through the connection of well defined functional nanobuilding blocks; (f) templated growth of inorganic or hybrid networks by using organic molecules and macromolecules other than surfactants, e.g., amines, alkyl ammonium ions, amphiphilic molecules, as structure directing agents, and (g) templating with nanoparticles, instead of surfactants, followed by removal of the nanoparticles, leaving behind a porous network. Suitable adjustment of the result effective parameters in these techniques may produce a nano-architected film having interconnected pores that are distributed in a substantially uniform fashion with neighboring pores separated by a distance of between about 1 nm and about 100 nm, wherein the pores have diameters of between about 1 nm and about 100 nm. The interconnected pores may be accessible from an underlying layer and/or overlying layer (if any). The pores in a porous nano-architected produced by any of these techniques may be filled with a pore-filling material having complementary charge transfer properties as described above.

VII. CONCLUSION

Embodiments of the present invention provide novel and useful transparent conducting electrodes and optoelectronic devices and power generation systems that use such electrodes as well as methods for the manufacture of such electrodes and optoelectronic devices using such electrodes. The nanostructured transparent conducting electrodes described herein are potentially less expensive to manufacture than conventional TCE's with comparable electrical resistance and optical transmission. Such nanostructured TCE's can facilitate the development and manufacture of a wide variety of new and useful devices. Such useful device include passive applications such as antistatic films, antireflective stacks, electromagnetic shielding, heat-efficient electrochemical windows, and electroluminescent lamps, and active applications such as flat panel displays, light emitting diodes, transparent membrane switches, touch screens, and thin film solar cells.

It is to be understood that the above description is intended to be illustrative and not restrictive. Many embodiments and variations of the invention will become apparent to those of skill in the art upon review of this disclosure. Merely by way of example a wide variety of process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. A nanostructured transparent conducting electrode, comprising:
    a nano-architected transparent porous film having a plurality of interconnected pores, wherein the pores are interconnected by an ordered network of connecting structures in the film;
    an electrically conductive material that substantially fills the pores and connecting structures in the nano-architected porous film to form a network of interconnected conductive structures in the porous film; and
    a layer of transparent conducting material, wherein the nano-architected porous film is disposed on the layer of transparent conducting material.

2. The nanostructured transparent conducting electrode of claim 1 wherein the pores are substantially uniformly distributed.

3. The nanostructured transparent conducting electrode of claim 1 wherein the pores have diameters of between about 1 nm and about 100 nm.

4. The nanostructured transparent conducting electrode of claim 3 wherein neighboring pores are separated by between about 1 nm and about 100 nm.

5. The nanostructured transparent conducting electrode of claim 1 wherein the electrically conductive material includes one or more metals.

6. The nanostructured transparent conducting electrode of claim 5 wherein the one or more metals are chosen from the group of aluminum, copper, gold, silver or other conductive metals.

7. The nanostructured transparent conducting electrode of claim 1 wherein the layer of transparent conducting material includes one or more transparent conducting oxides.

8. The nanostructured transparent conducting electrode of claim 7 wherein one or more transparent conducting oxides are chosen from the group of indium tin oxide (ITO), tin oxide, fluorinated tin oxide (F:SnO$_2$), zinc oxide, aluminum-doped zinc oxide, fluorine-doped In$_2$O$_3$, and gadolinium indium oxide.

9. The nanostructured transparent conducting electrode of claim 1 further comprising a substrate, wherein the layer of transparent conducting material is disposed between the substrate and the nano-architected porous film.

10. The nanostructured transparent conducting electrode of claim 9, wherein the substrate is made from a transparent material.

11. The nanostructured transparent conducting electrode of claim 1 wherein the porous film is made from one or more materials selected from the group of SiO$_2$, TiO$_2$, ZrO$_2$, and ZnO.

12. The nanostructured transparent conducting electrode of claim 11 wherein the electrically conductive material comprises a semiconducting material that includes one or more materials selected from the group of Titania, (TiO$_2$) zinc oxide (ZnO), zirconium oxide, niobium oxide, tungsten oxide, strontium oxide, copper oxide, calcium/titanium oxide, sodium titanate, potassium niobate, Cadmium Selenide (CdSe), Cadmium Sulfide (CdS), or Cadmium Telluride (CdTe) and blends of two or more such materials such as TiO$_2$/SiO$_2$ blends/hybrids.

13. The nanostructured transparent conducting electrode of claim 1 wherein the porous film with the electrically conductive material is substantially transparent to radiation within a desired range of frequencies.

14. The nanostructured transparent conducting electrode of claim 1 wherein the conducting structures facilitate electrical conduction horizontally and laterally through the plane of the nano-architected porous film.

15. The nanostructured transparent conducting electrode of claim 1 wherein spacing of the pores in the nano-architected porous film is less than a shortest wavelength of radiation to which the transparent conducting electrode is to be made transparent.

16. The nanostructured transparent conducting electrode of claim 1 wherein interconnected pores are accessible from an underlying layer.

17. The nanostructured transparent conducting electrode of claim 1 wherein the ordered network of interconnected conducting structures facilitate electrical conduction both perpendicular to and within in the plane of the nano-architected porous film.

18. The nanostructured transparent conducting electrode of claim 1 wherein the pores are interconnected such that they provide a network of paths within the plane of the nano-architected porous film.

19. The nanostructured transparent conducting electrode of claim 1 wherein the pores each have a diameter of about 2 nm to about 50 nm.

20. The nanostructured transparent conducting electrode of claim 1 wherein the electrode has a resistivity of between about $10^{-6}$ Ωcm and about 250 Ωcm.

21. The nanostructured transparent conducting electrode of claim 1 wherein the electrode has a resistivity of between about $10^{-6}$ Ωcm and about 50 Ωcm.

22. The nanostructured transparent conducting electrode of claim 1 wherein the electrode has a resistivity of between about $10^{-6}$ Ωcm and about 10 Ωcm.

23. The nanostructured transparent conducting electrode of claim 1 wherein the electrode has a resistivity of between about $10^{-6}$ Ωcm and about 1 Ωcm.

24. The nanostructured transparent conducting electrode of claim 1 wherein conducting structures comprise of a plurality of orthogonally connected structures.

25. The nanostructured transparent conducting electrode of claim 1 wherein conducting structures comprise of a plurality of parallel wires orthogonally connected to another set of parallel wires.

26. The nanostructured transparent conducting electrode of claim 1 wherein the film has a configuration to transmit radiation within a desired range of frequencies.

27. The nanostructured transparent conducting electrode of claim 1 wherein interconnected pores are accessible from an overlying layer.

28. The nanostructured transparent conducting electrode of claim 1 wherein the network of interconnected conductive structures comprises of interconnected metal nanowires.

29. The nanostructured transparent conducting electrode of claim 28 wherein the nanowires conduct electrons substantially parallel to the plane the nanostructured layer.

30. The nanostructured transparent conducting electrode of claim 28 wherein the columns interconnect with nanowires columns that conduct electrons substantially perpendicular to the plane of the nanostructured layer.

31. The nanostructured transparent conducting electrode of claim 30 wherein diameter and spacing of the nanowires and columns are selected to provide both high radiation transmission and low electrical resistance.

32. The nanostructured transparent conducting electrode of claim 1 wherein said pores are roughly 1 nm to 100 nm in diameter and neighboring said pores are between about 1 nm and about 100 nm apart measured from nearest edge to nearest edge.

33. The nanostructured transparent conducting electrode of claim 1 wherein said pores are roughly 2 nm to 50 nm in diameter and neighboring said pores are between about 2 nm to 50 nm apart measured from nearest edge to nearest edge.

34. The nanostructured transparent conducting electrode of claim 1 wherein the pores are interconnected with each other and accessible from the transparent conducting layer and any overlying layer, wherein the porous film is made by sol-gel based self-assembly of porous nanofilms to construct a mold having 1-100 nm diameter pores spaced 1-100 nm apart.

35. The nanostructured transparent conducting electrode of claim 1 wherein the electrically conductive material is one or more of the following: a metal, copper, aluminum, silver, intermetallics, conducting metal-oxides, conducting polymers, or an alloy of metals.

36. The nanostructured transparent conducting electrode of claim 1 wherein the resistivity of the layer of transparent conducting material is between about 10,000 Ωcm and about 1 Ωcm.

37. The nanostructured transparent conducting electrode of claim 1 wherein the resistivity of the layer of transparent conducting material is between about 1000 Ωcm and about 250 Ωcm.

38. The nanostructured transparent conducting electrode of claim 1 wherein the layer of transparent conducting material is relatively poor in terms of roughness and defects.

39. A nanostructured transparent conducting electrode, comprising:
a nano-architected transparent porous film having a plurality of interconnected pores, wherein the pores are interconnected by an ordered network of connecting structures in the film;
an electrically conductive material that substantially fills the pores and connecting structures in the nano-architected porous film to form a network of interconnected conducting structures in the porous film; and a layer of transparent conducting material coupled to the porous film.

40. The nanostructured transparent conducting electrode of claim 39 wherein the pores are substantially uniformly distributed.

41. The nanostructured transparent conducting electrode of claim 39 wherein the pores have diameters of between about 1 nm and about 100 nm.

42. The nanostructured transparent conducting electrode of claim 41 wherein neighboring pores are separated by between about 1 nm and about 100 nm.

43. The nanostructured transparent conducting electrode of claim 39 wherein the electrically conductive material includes one or more metals.

44. The nanostructured transparent conducting electrode of claim 43 wherein the one or more metals are chosen from the group of aluminum, copper, gold, silver or other conductive metals.

45. The nanostructured transparent conducting electrode of claim 39 wherein the layer of transparent conducting material includes one or more transparent conducting oxides.

46. The nanostructured transparent conducting electrode of claim 45 wherein one or more transparent conducting oxides are chosen from the group of indium tin oxide (ITO), tin oxide, fluorinated tin oxide ($F:SnO_2$), zinc oxide, aluminum-doped zinc oxide, fluorine-doped $In_2O_3$, and gadolinium indium oxide.

47. The nanostructured transparent conducting electrode of claim 39 wherein the porous film is made from one or more materials selected from the group of $SiO_2$, $TiO_2$, $ZrO_2$, and ZnO.

48. The nanostructured transparent conducting electrode of claim 47 wherein the electrically conductive material comprises a semiconducting material that includes one or more materials selected from the group of Titania, ($TiO_2$) zinc oxide (ZnO), zirconium oxide, niobium oxide, tungsten oxide, strontium oxide, copper oxide, calcium/titanium oxide, sodium titanate, potassium niobate, Cadmium Selenide (CdSe), Cadmium Sulfide (CdS), or Cadmium Telluride (CdTe) and blends of two or more such materials such as $TiO_2/SiO_2$ blends/hybrids.

49. The nanostructured transparent conducting electrode of claim 39 wherein the porous film with the electrically conductive material is substantially transparent to radiation within a desired range of frequencies.

50. The nanostructured transparent conducting electrode of claim 39 wherein the conducting structures facilitate electrical conduction horizontally and laterally through the plane of the nano-architected porous film.

51. The nanostructured transparent conducting electrode of claim 39 wherein spacing of the pores in the nano-architected porous film is less than a shortest wavelength of radiation to which the transparent conducting electrode is to be made transparent.

52. The nanostructured transparent conducting electrode of claim 39 wherein interconnected pores are accessible from an underlying layer.

53. The nanostructured transparent conducting electrode of claim 39 wherein the ordered network of interconnected conducting structures facilitate electrical conduction both perpendicular to and within in the plane of the nano-architected porous film.

54. The nanostructured transparent conducting electrode of claim 39 wherein the pores are interconnected such that they provide a network of paths within the plane of the nano-architected porous film.

55. The nanostructured transparent conducting electrode of claim 39 wherein the pores each have a diameter of about 2 nm to about 50 nm.

56. The nanostructured transparent conducting electrode of claim 39 wherein the electrode has a resistivity of between about $10^{-6}$ $\Omega$cm and about 1 $\Omega$cm.

57. The nanostructured transparent conducting electrode of claim 39 wherein conducting structures comprise of a plurality of orthogonally connected structures.

58. The nanostructured transparent conducting electrode of claim 39 wherein interconnected pores are accessible from an overlying layer.

59. A nanostructured transparent conducting electrode, comprising:

a nano-architected transparent porous film having a plurality of interconnected pores, wherein the pores are interconnected by an ordered network of connecting structures in the film;

an electrically conductive material that substantially fills the pores and connecting structures in the nano-architected porous film to form a network of interconnected conductive structures in the porous film; and a layer of transparent conducting material coupled to the porous film, wherein the network of interconnected conductive structures comprises of interconnected metal nanowires.

60. The nanostructured transparent conducting electrode of claim 59 wherein the nanowires conduct electrons substantially parallel to the plane the nanostructured layer.

61. The nanostructured transparent conducting electrode of claim 59 wherein the columns interconnect with nanowires columns that conduct electrons substantially perpendicular to the plane of the nanostructured layer.

62. The nanostructured transparent conducting electrode of claim 59 wherein said pores are roughly 1 nm to 100 nm in diameter and neighboring said pores are between about 1 nm and about 100 nm apart measured from nearest edge to nearest edge.

63. The nanostructured transparent conducting electrode of claim 59 wherein said pores are roughly 2 nm to 50 nm in diameter and neighboring said pores are between about 2 nm to 50 nm apart measured from nearest edge to nearest edge.

64. The nanostructured transparent conducting electrode of claim 1 wherein the pores are interconnected with each other and accessible from the transparent conducting layer and any overlying layer, wherein the porous film is made by sol-gel based self-assembly of porous nanofilms to construct a mold having 1-100 nm diameter pores spaced 1-100 nm apart.

65. A nanostructured transparent conducting electrode, comprising:

a nano-architected transparent porous film having a plurality of interconnected pores, wherein the pores are interconnected by an ordered network of connecting structures in the film;

an electrically conductive material that substantially fills the pores and connecting structures in the nano-architected porous film to form a network of interconnected conductive structures in the porous film; and a layer of transparent conducting material coupled to the porous film;

wherein the electrically conductive material includes one or more of the following: a metal, copper, aluminum, silver, intermetallics, conducting metal-oxides, conducting polymers, or alloy of metals.

66. The nanostructured transparent conducting electrode of claim 65 wherein the resistivity of the layer of transparent conducting material is between about 10,000 Ωcm and about 1 Ωcm.

67. A nanostructured transparent conducting electrode, comprising:
a nano-architected transparent porous film having a plurality of interconnected pores, wherein the pores are interconnected by an ordered network of connecting structures in the film;
an electrically conductive material that substantially fills the pores and connecting structures in the nano-architected porous film to form a network of interconnected conductive structures in the porous film; and
a layer of transparent conducting material coupled to the porous film, wherein resistivity of the layer of transparent conducting material is between about 1000 Ωcm and about 250 Ωcm.

68. The nanostructured transparent conducting electrode of claim 67 wherein the layer of transparent conducting material is relatively inexpensive transparent conducting films with high resistivity between about 1000 Ωcm and 250 Ωcm to build low resistivity nanostructured transparent conducting electrodes.

* * * * *